US010983011B2

(12) United States Patent
Petrzilek et al.

(10) Patent No.: US 10,983,011 B2
(45) Date of Patent: Apr. 20, 2021

(54) LIFETIME DETERMINING TECHNIQUE FOR A SOLID ELECTROLYTIC CAPACITOR AND SYSTEM FOR THE SAME

(71) Applicant: AVX Corporation, Fountain Inn, SC (US)

(72) Inventors: Jan Petrzilek, Usti nad Orlici (CZ); Miloslav Uher, Lanskroun (CZ)

(73) Assignee: AVX Corporation, Fountain Inn, SC (US)

( * ) Notice: Subject to any disclaimer, the term of this patent is extended or adjusted under 35 U.S.C. 154(b) by 292 days.

(21) Appl. No.: 15/966,065

(22) Filed: Apr. 30, 2018

(65) Prior Publication Data

US 2018/0321090 A1  Nov. 8, 2018

Related U.S. Application Data

(60) Provisional application No. 62/502,810, filed on May 8, 2017.

(51) Int. Cl.
| | |
|---|---|
| *G01K 3/04* | (2006.01) |
| *G01R 31/64* | (2020.01) |
| *G01R 27/26* | (2006.01) |
| *G01R 31/00* | (2006.01) |
| *H01G 9/025* | (2006.01) |

(Continued)

(52) U.S. Cl.
CPC ........... *G01K 3/04* (2013.01); *G01R 27/2605* (2013.01); *G01R 31/003* (2013.01); *G01R 31/64* (2020.01); *H01G 9/0003* (2013.01); *H01G 9/025* (2013.01); *H01G 9/15* (2013.01); *H01G 9/012* (2013.01); *H01G 9/042* (2013.01); *H01G 9/052* (2013.01)

(58) Field of Classification Search
CPC ........ G01K 3/04; G01R 31/64; G01R 31/003; H01G 9/0003; H01G 9/025; H01G 9/15; H01G 9/012; H01G 9/042; H01G 9/052
See application file for complete search history.

(56) References Cited

U.S. PATENT DOCUMENTS

| 5,111,327 A | 5/1992 | Blohm et al. |
| 5,457,862 A | 10/1995 | Sakata et al. |

(Continued)

FOREIGN PATENT DOCUMENTS

| CN | 102033182 A | 4/2011 |
| CN | 102262191 B | 4/2016 |

(Continued)

OTHER PUBLICATIONS

Escobar et al., "A Review of Accelerated Test Models," *Statistical Science*, vol. 21, No. 4, 2006, pp. 552-577.

(Continued)

*Primary Examiner* — Nathaniel T Woodward
*Assistant Examiner* — Philip L Cotey
(74) *Attorney, Agent, or Firm* — Dority & Manning, P.A.

(57) ABSTRACT

A system and method for determining the lifetime of a capacitor element, specifically a capacitor element comprising a solid electrolyte that undergoes oxidation, is provided. The system and method utilize a capacitor element comprising an anode body, a dielectric, and a solid electrolyte, and may also comprise other stages of the production of a capacitor. The system and method provide an estimation of the life of the capacitor while considering the oxidation of the solid electrolyte.

20 Claims, 4 Drawing Sheets

(51) Int. Cl.
  H01G 9/00    (2006.01)
  H01G 9/15    (2006.01)
  H01G 9/052    (2006.01)
  H01G 9/012    (2006.01)
  H01G 9/042    (2006.01)

(56) References Cited

U.S. PATENT DOCUMENTS

| | | | |
|---|---|---|---|
| 5,473,503 | A | 12/1995 | Sakata et al. |
| 5,729,428 | A | 3/1998 | Sakata et al. |
| 5,812,367 | A | 9/1998 | Kudoh et al. |
| 6,635,729 | B1 | 10/2003 | Groenendaal et al. |
| 6,987,663 | B2 | 1/2006 | Merker et al. |
| 7,262,511 | B2 | 8/2007 | Osako et al. |
| 7,515,396 | B2 | 4/2009 | Biler |
| 8,004,288 | B1 * | 8/2011 | Sherwood .............. G01R 31/64 324/548 |
| 8,824,122 | B2 * | 9/2014 | Vilc ...................... H01G 9/042 361/523 |
| 9,371,587 | B2 | 6/2016 | Isogai |
| 9,541,607 | B2 * | 1/2017 | Millman ............ G01R 31/2849 |
| 10,074,487 | B2 | 9/2018 | Wakatsuki et al. |
| 10,591,527 | B2 * | 3/2020 | Millman ................ G01R 31/64 |
| 2009/0112493 | A1 * | 4/2009 | Abdennadher .... G01R 27/2605 702/58 |
| 2009/0167541 | A1 * | 7/2009 | Dooley ................. G01R 31/64 340/635 |
| 2011/0241695 | A1 * | 10/2011 | Younsi .................. G01R 31/40 324/548 |
| 2013/0090900 | A1 * | 4/2013 | Gering ................ G01R 31/392 703/2 |
| 2014/0067303 | A1 * | 3/2014 | Millman ................. H01G 9/15 702/84 |

FOREIGN PATENT DOCUMENTS

| | | |
|---|---|---|
| JP | 2002267708 A | 9/2002 |
| JP | 2010093046 A | 4/2010 |

OTHER PUBLICATIONS

Liu, David (Donhang), "Reliability and Other Space-Related Characterizations of Polymer Aluminum Capacitors," *CARTS International*, Mar. 26-29, 2012, Las Vegas, NV, pp. 147-155.

Spence, Penelope, "Status Report Characterization of Polymer Tantalum Capacitors, FY12," NASA Electronic Parts and Packaging (NEPP) Program, Office of Safety and Mission Assurance, *National Aeronautics and Space Administration*, 2013, pp. 1-9.

Teverovsky, Alexander, "Evaluation of Polymer Hermetically Sealed Tantalum Capacitors," *NASA Electronics Parts and Packaging (NEPP) Program*, pp. 1-49.

International Search Report and Written Opinion for PCT/US2018/030565 dated Sep. 3, 2018, 11 pages.

* cited by examiner

LIFETIME DETERMINING TECHNIQUE FOR A SOLID ELECTROLYTIC CAPACITOR AND SYSTEM FOR THE SAME

CROSS REFERENCE TO RELATED APPLICATION

The present application claims filing benefit of U.S. Provisional Patent Application Ser. No. 62/502,810 having a filing date of May 8, 2017, which is incorporated herein by reference in its entirety.

BACKGROUND OF THE INVENTION

Electrolytic capacitors (e.g., tantalum capacitors) are increasingly being used in the design of circuits due to their volumetric efficiency, reliability, and process compatibility. For example, one type of capacitor that has been developed is a solid electrolytic capacitor that includes a tantalum anode, dielectric layer, and conductive polymer solid electrolyte. Certain types of conductive polymer electrolytes (e.g., PEDT) are highly sensitive due to the tendency of such polymers to be oxidized. The capacitance of polymer capacitors degrades over time due to oxidative processes that are temperature dependent. It is often beneficial to have an estimate or model of the expected degradation to anticipate such degradation. However, due to the large lifetimes of these capacitors at operating temperatures, determining the lifetime of capacitors at such low temperatures is often not practical.

Previous methods of determining the life of the capacitor use the "20 degree rule" shown by the following:

$$L_x = L_0 b^{\frac{T_0 - T_x}{20}} \tag{9}$$

where $L_0$ is the life of the capacitor at temperature $T_0$, $L_x$ is the life of the capacitor at $T_x$, and b is a factor for how the degradation is temperature dependent. Factor b varies based on the type of capacitor. For example, factor b may range from 1 to 10, with 10 indicating that the capacitor is very temperature dependent. Generally, if there is more protection of the solid electrolyte in the capacitor, $L_0$ will be higher.

However, the 20-degree rule is a simplified rough tool that does not reflect the physical chemical background of capacitor degradation.

As such, a need exists for an improved technique for determining the lifetime of solid electrolytic capacitors and anticipating future degradation.

SUMMARY OF THE INVENTION

In accordance with one embodiment of the present invention, a capacitor lifetime determining system is disclosed that comprises a capacitor element; a capacitance measuring device, the measuring device configured to measure the capacitance of the capacitor element; a control device, the control device configured to apply thermodynamic temperatures to the system; and a computing device. The capacitor element comprises a sintered porous anode body, a dielectric that overlies the anode body, and a solid electrolyte that overlies the dielectric, wherein the solid electrolyte comprises a conductive polymer. The computing device is configured to determine constants A/x and −E/k associated with data obtained at the applied thermodynamic temperatures based on technique $$\frac{A}{x} t e^{[\frac{-E}{k}]\frac{1}{T}} = 1 \tag{1}$$

wherein x is an amount of oxidized solid electrolyte, t is a time in which the capacitance of the capacitor element is decreased by a specified level, T is a thermodynamic temperature, A is a frequency factor, k is Boltzmann constant, e is Euler constant, and E is an activation energy of the reaction. The computing device is configured to determine a time to degradation to the specified level at a proposed thermodynamic temperature using the activation energy and frequency factor associated with the applied thermodynamic temperatures based on technique (1).

In accordance with another embodiment of the present invention, a method of determining the lifetime of a capacitor is disclosed that comprises controlling a first temperature to which a first capacitor element is exposed, measuring a capacitance of the first capacitor element after exposure to the first temperature, determining a time in which the capacitance of the first capacitor element during exposure to the first temperature is decreased by a specified level, controlling a second temperature to which a second capacitor element is exposed, measuring a capacitance of the second capacitor element after exposure to the second temperature, determining a time in which the capacitance of the second capacitor element during exposure to the second temperature is decreased by the specified level, applying technique (1) to determine constants A/x and −E/k associated with the first and second temperatures:

$$\frac{A}{x} t e^{[\frac{-E}{k}]\frac{1}{T}} = 1, \tag{1}$$

and applying the constants A/x and −E/k associated with the first and second temperatures to technique (1) to determine the time to degradation at a third temperature. The first and second capacitor elements comprise a sintered anode body, a dielectric formed along the sintered anode body, and a solid electrolyte formed along the dielectric, wherein the solid electrolyte comprises a conductive polymer.

Other features and aspects of the present invention are set forth in greater detail below.

BRIEF DESCRIPTION OF THE DRAWING

A full and enabling disclosure of the present invention, including the best mode thereof, directed to one of ordinary skill in the art, is set forth more particularly in the remainder of the specification, which makes reference to the appended figure in which.

Figure 1:
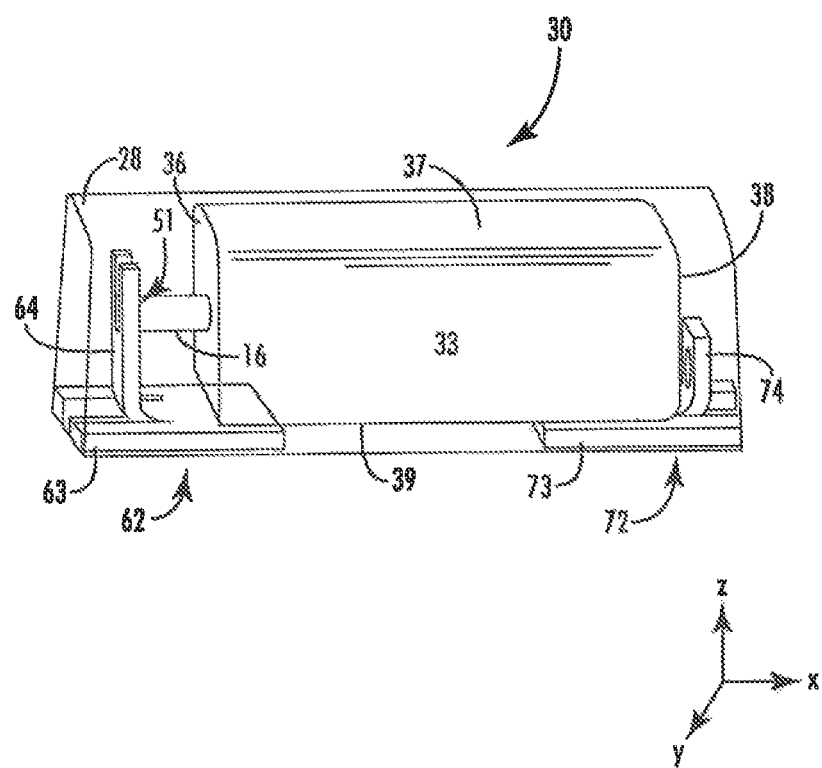
FIG. 1 is a schematic illustration of one embodiment of a capacitor that may be formed in accordance with the present invention.

Repeat use of reference characters in the present specification and drawings are intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a method for determining the life of a capacitor, specifically a solid electrolytic capacitor, and a system utilizing the same. The present method can provide an estimate of the lifetime of capacitors at low temperatures without needing to physically test the capacitors at low temperatures. The present method and system are based on testing the capacitance of solid electrolytic capacitors at two or more temperatures (e.g., about 125° C.), determining certain specified parameters based on measurements at such temperatures, and determining the estimated lifetime or degradation to a specified level for the solid electrolytic capacitors at another temperature based on the specified parameters. The technique can be applied not only to finished (e.g., fully assembled) capacitors, but also can be applied to various intermediate products. This technique can be used to model the capacitance degradation over time and can be used to identify critical technological steps influencing the degradation of the capacitor. The technique can thereby become an important step in developing capacitors with long lifetime.

It has been observed that no change may occur in the capacitance of a solid electrolytic capacitor under an inert atmosphere and temperatures up to 125° C. However, as a solid electrolyte, specifically a polymer electrolyte, is exposed to oxygen and oxidizes, the electrolyte may lose its conductivity resulting in an increase in equivalent series resistance ("ESR") and a decrease in capacitance.

In the present method, the rate of reaction between the conductive polymer and oxygen is assumed to be independent of polymer concentration. Further, since capacitance starts decreasing after a critical minimum coverage of dielectric is reached, the amount of capacitance change does not reflect the total amount of polymer. The reaction rate constant for the reaction between the conductive polymer and oxygen can be shown by the following:

$$\frac{dx}{dt} = k_r \quad (2)$$

where x is the amount of oxidized conductive polymer, t is time, and $k_r$ is the rate constant. The temperature dependence of reactions can be described by the Arrhenius equation:

$$k_r = Ae^{[\frac{-E}{kT}]} \quad (3)$$

where
A is the pre-exponential factor or the "frequency factor,"
k is Boltzmann constant,
e is Euler constant,
T is the thermodynamic temperature, and
E is the activation energy of the reaction.

Capacitance degradation to a specified level is assumed to be due to the amount of oxidized polymer (x). The present technique assumes that reaching the same capacitance degradation will require the same extent of oxidation (same amount of oxidized polymer) under various temperatures. Accordingly, the following reaction rates for reactions at temperature $T_1$ and temperature $T_2$ can be combined:

$$k_{r1} = \frac{x}{t_1} = Ae^{[\frac{-E}{kT_1}]} \quad (4)$$

$$k_{r2} = \frac{x}{t_2} = Ae^{[\frac{-E}{kT_2}]} \quad (5)$$

$$x = t_1 Ae^{[\frac{-E}{kT_1}]} = t_2 Ae^{[\frac{-E}{kT_2}]} \quad (6)$$

$$\frac{t_1}{t_2} = e^{[\frac{E}{k}(\frac{1}{T_1} - \frac{1}{T_2})]} \quad (7)$$

The present technique assumes that capacitance degradation to a specified level requires time needed to oxidize the polymer by an amount x. This amount is equal at all temperatures. The present technique is based on measuring times needed to specified capacitance degradation under specified temperature. The present technique thereby describes the reaction by the following:

$$\frac{x}{t} = Ae^{[\frac{-E}{kT}]} \quad (8)$$

$$\frac{A}{x} te^{[\frac{-E}{k}]\frac{1}{T}} = 1 \quad (1)$$

where A, x, and E are constant for all temperatures, and t and T are parameters describing the reaction conditions. Data obtained at least at two different temperatures needs to be measured in order to calculate constants A/x and −E/k of technique 1. Values for constants A/x and −E/k can then be estimated by means of numerical optimization (e.g., least squares or maximum likelihood) to find such combination of constants A/x and −E/k that will best fit the data (e.g., all measured combinations of t and T). Constants A/x and −E/k can also be estimated using the logarithmic form of the above technique and plotting 1/T verse ln(t). Graphical evaluation of the slope and intercept will provide the constants A/x and −E/k. Once these constants are determined, the time to degradation may be determined at any temperature using the above technique 1. Accordingly, the time to degradation can be estimated at operating temperatures without needing to test the capacitor at such temperatures.

The present technique allows for the capacitance degradation to be put in terms comparable to other reactions. The activation energy for capacitance degradation for each capacitor type can be compared to other activation energies for reactions beyond the degradation of capacitance. Values of activation energy can be used for a deeper understanding of the physical or chemical processes leading to capacitor degradation.

Further, the present technique can be applied to various intermediate stages of the capacitor. For instance, in some embodiments, the present technique may be applied to the capacitor after formation of the solid electrolyte (e.g., after formation of an inner polymer layer or an outer polymer layer), after formation of a graphite layer, and after formation of a silver layer. The technique can be applied to the capacitor after complete assembly of the capacitor and/or any stage before that assembly. The degradation of the solid electrolyte includes various steps (e.g., diffusion of oxygen through the protective layers, potential reaction of oxygen with those protective layers, and oxidation of the solid electrolyte). Each stage may have its own contribution to the rate of degradation of the capacitor. The rate determining step (the slowest process) of degradation may give the temperature dependency of the whole degradation process.

In the present method, the capacitor element may be exposed to an oxygen environment, and in some cases, may be exposed to environments with high humidity levels, such as when placed into contact with an atmosphere having a relative humidity of about 40% or more, in some embodiments about 45% or more, in some embodiments about 50% or more, and in some embodiments, about 70% or more (e.g., about 85% to 100%). Relative humidity may, for instance, be determined in accordance with ASTM E337-02, Method A (2007). The oxygen-containing atmosphere and/or humid atmosphere may be part of the internal atmosphere of the capacitor assembly itself, or it may be an external atmosphere to which the capacitor assembly will be exposed to during use.

The capacitance of the capacitor elements may be maintained for about 100 hours or more, in some embodiments from about 300 hours to about 3,000 hours, and in some embodiments, from about 400 hours to about 2,500 hours (e.g., 500 hours, 600 hours, 700 hours, 800 hours, 900 hours, 1,000 hours, 1,100 hours, 1,200 hours, or 2,000 hours) at temperatures ranging from 50° C. to 250° C., and, in some embodiments from 70° C. to 200° C., and in some embodiments, from 80° C. to about 150° C. (e.g., 85° C.). In one embodiment, for instance, the values may be maintained for 1,000 hours at a temperature of 85° C.

Various embodiments of the lifetime determining technique, and system for utilizing the lifetime determining technique will now be described in more detail. The system for utilizing the present technique will generally include a capacitor element. While the present disclosure has been limited to capacitors discussed below (which may include terminations and casing material as discussed below), the present methods and systems can be applied to various capacitors beyond those discussed herein without deviating from the intent of the present disclosure.

I. Lifetime Determining Technique

Figure 2:
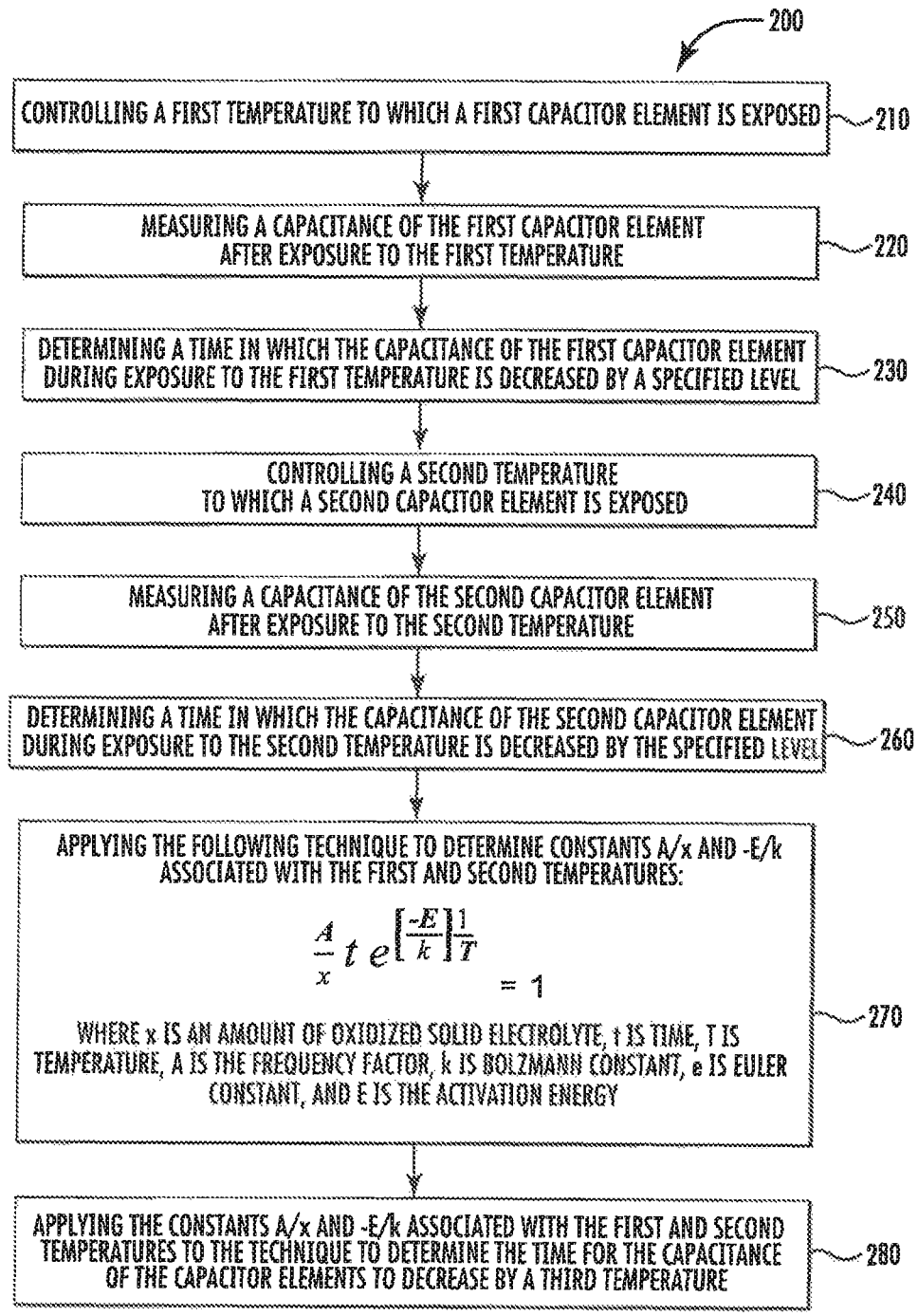
FIG. 2 is a flowchart of one embodiment of a lifetime determining technique that may be performed in accordance with the present invention.

FIG. 2 is a flowchart of one embodiment of the present lifetime determining technique that may be performed in accordance with the present invention. In particular, FIG. 2 illustrates a method 200 of determining the lifetime of a capacitor. The method 200 includes controlling temperatures to which the capacitor elements are exposed 210, 240 (first and second groups of capacitor elements exposed to first and second temperatures); measuring a capacitance of the capacitor elements 220, 250; determining a time in which the capacitance of the capacitor elements during exposure to the temperatures is decreased by a specified level 230, 260; applying the following technique to determine constants A/x and −E/k associated with the tested temperatures:

$$\frac{A}{x} t e^{[\frac{-E}{k}]\frac{1}{T}} = 1 \qquad (1)$$

270; and applying the determined constants A/x and −E/k associated with the tested temperatures to the above technique to determine the time to degradation at a desired temperature 280. In the technique, x is the amount of oxidized solid electrolyte, t is the time in which the capacitance of the capacitor element is decreased by specified value (e.g., 10%, 20%, 30%, 40%, 50%, 60%, 70%, 80%, 90%, 100%), T is the thermodynamic temperature, A is the frequency factor, k is Boltzmann constant, e is Euler constant, and E is the activation energy of the reaction.

In certain embodiments, controlling the temperature to which the capacitor element is exposed, measuring the capacitance of the capacitor element after exposure to the temperature, and determining a time for a decrease in capacitance to a specified level of the capacitor element may be performed at a variety of temperatures and may be repeated with the same or different capacitor elements at a variety of temperatures. In some embodiments, the capacitor elements tested are of similar construction such that the degradation can be compared. The tested or applied temperatures will generally be an "elevated temperature" (e.g., a temperature higher than the operating temperature of the capacitor), such as about 70° C. to about 250° C., or about 70° C. to about 175° C. The desired or proposed temperature (s) will generally be equivalent to the operating temperature or a temperature for which it is desired to estimate the time to degradation. For instance, the desired temperature may be about 20° C. to about 250° C., such as about 20° C. to about 175° C., or about 70° C. to about 85° C. Reference to a "first" and "second" temperature does not necessarily indicate numerical order and the degradation rate may be estimated at a third temperature, fourth temperature, or more. In some embodiments, the time to achieve a specified capacitance level or specified value of decrease in capacitance can be calculated by interpolation between several measurements (e.g., if the capacitance measurement is not continuous, capacitances higher and lower than the specified value may be obtained and interpolation can be used to determine the time in which the capacitance of the capacitor elements during exposure to the temperatures is decreased by the specified level).

The capacitor element may include an anode body, such as a sintered porous anode body, a dielectric that overlies the anode body, and a solid electrolyte that overlies the dielectric as described above as well as other components described herein, such as a graphite layer and a silver layer. The present method can estimate the time to degradation at various production stages in the capacitor for further evaluation. The present method is particularly beneficial to estimate the degradation of polymer electrolytes, such as PEDT, PEDT-PSS, or PPY polymer electrolytes, as these electrolytes are particularly affected by oxidation.

Applying the above technique to determine constants A/x and −E/k associated with the tested temperatures may be performed by numerical optimization (e.g., least squares or maximum likelihood) to find such combination of constants A/x and −E/k that will best fit the data (e.g., all measured combinations of t and T). This may also be performed by using the logarithmic form of the above technique and plotting 1/T verse ln(t). Graphical evaluation of the slope and intercept will provide the constants A/x and −E/k. The analysis may take into consideration the time to degradation at a variety of temperatures.

Once constants A/x and −E/k are determined, the constants can be applied to the above technique to determine the time to degradation at a desired temperature. The data can be used to extrapolate the degradation of the capacitor element for one or more desired temperatures. For instance, the degradation to a specified level can be determined using a plurality of capacitor elements at a plurality of temperatures and then used to estimate the degradation at a plurality of desired temperatures.

Figure 3:
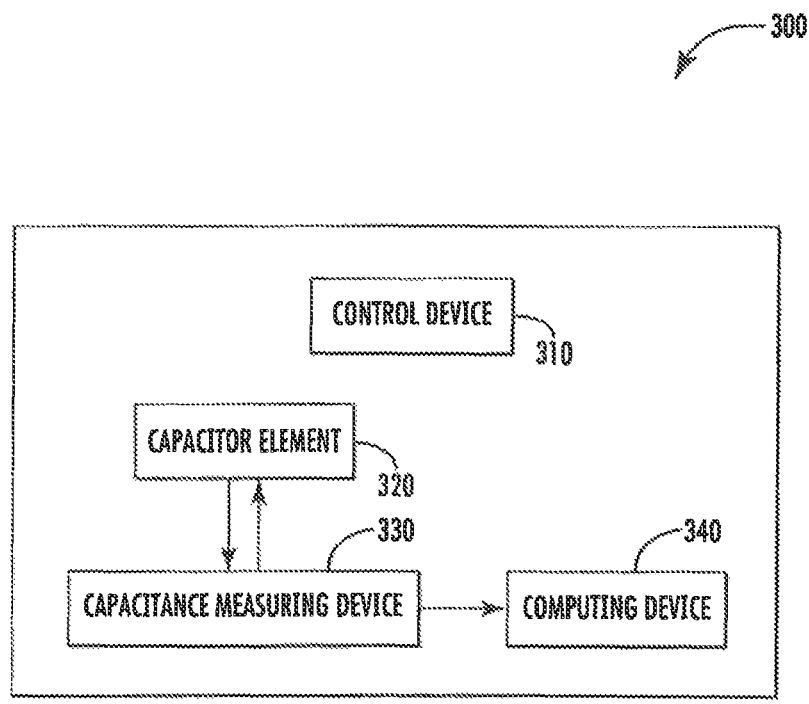
FIG. 3 is a schematic illustration of one embodiment of a system in accordance with the present invention.

FIG. 3 is a schematic illustration of one embodiment of a system in accordance with the present invention. In the embodiment illustrated in FIG. 3, the system 300 includes a control device 310, a capacitor element 320, a capacitance measuring device 330, and a computing device 340. The capacitor element 320 can include an anode body, such as a sintered porous anode body, a dielectric that overlies the anode body, and a solid electrolyte that overlies the dielectric as described above as well as other components described herein. The capacitance measuring device 330 can be configured to determine the capacitance of the capacitor element. For instance, the measuring device may be an LCR or LCZ meter or other instruments for determining the capacitance of a device. The capacitance may be directly measured or may be calculated based on other measured characteristics. The system may also include separate devices that can measure the temperature, humidity, time, and any other variable that is desired. These measurements may be taken by a single measuring device or multiple devices. In the embodiment illustrated in FIG. 3, the system 300 includes a control device 310 that may be configured to apply a temperature to the system. The control device 310 may also be configured to modify the humidity and/or oxygen content of the environment to which the capacitor element is exposed.

The computing device 340 may be one that can determine constants A/x and −E/k associated with the tested temperatures based on the following technique:

$$\frac{A}{x} t e^{[\frac{-E}{k}]\frac{1}{T}} = 1 \quad (1)$$

wherein x is the amount of oxidized solid electrolyte, t is the time in which the capacitance of the capacitor element is decreased by a specified level, T is the temperature, A is the frequency factor, k is Boltzmann constant, e is Euler constant, and E is the activation energy of the reaction. The same computing device or a second computing device may determine the time to degradation at a desired temperature using the constants A/x and −E/k associated with the tested temperatures again using the above technique.

The one or more computing devices may be any suitable computer or device that is able to calculate the constants A/x and −E/k associated with the tested temperatures based on the above technique and then apply the determined constants A/x and −E/k to the above technique to determine the time for degradation at one or more desired temperatures.

Multiple systems as illustrated in FIG. 3 may be used in the present technique and in some embodiments, the system illustrated in FIG. 3 may include one or more control devices, one or more capacitor elements, one or more capacitance measuring devices, one or more computing devices, and other components as desired. For instance, in some embodiments, a plurality of capacitor elements may be used in the system, with each capacitor element engaging with the same or different control device, capacitance measuring device, and computing device. Various variations of the system illustrated in FIG. 3 may be used with the present technique.

Using the present method and system, the degradation rate to a specified level can be determined for various stages of production of the capacitor. For instance, the degradation rate of a capacitor element comprising only an anode, dielectric, and solid electrolyte may be determined, while the degradation rate of a capacitor element comprising an anode, dielectric, solid electrolyte, and external polymer coating may also be determined. The degradation rate of a capacitor element comprising an anode, dielectric, solid electrolyte, and an external polymer coating and/or cathode coating may be determined, while a capacitor element comprising those components as well as a casing material may be determined. The activation energies for these various capacitor elements can then be compared and used to further develop the capacitor. For instance, the degradation rates and activation energies for these various capacitor elements can be used to determine the component that has the greatest effect on the degradation rate of the capacitor and thereby allow the capacitor to be improved based on this knowledge.

II. Capacitor Element

A. Anode Body

The capacitor element includes an anode that contains a dielectric formed on a sintered porous body. The porous anode body may be formed from a powder that contains a valve metal (i.e., metal that is capable of oxidation) or valve metal-based compound, such as tantalum, niobium, aluminum, hafnium, titanium, alloys thereof, oxides thereof, nitrides thereof, and so forth. The powder is typically formed from a reduction process in which a tantalum salt (e.g., potassium fluotantalate ($K_2TaF_7$), sodium fluotantalate ($Na_2TaF_7$), tantalum pentachloride ($TaCl_5$), etc.) is reacted with a reducing agent. The reducing agent may be provided in the form of a liquid, gas (e.g., hydrogen), or solid, such as a metal (e.g., sodium), metal alloy, or metal salt. In one embodiment, for instance, a tantalum salt (e.g., $TaCl_5$) may be heated at a temperature of from about 900° C. to about 2,000° C., in some embodiments from about 1,000° C. to about 1,800° C., and in some embodiments, from about 1,100° C. to about 1,600° C., to form a vapor that can be reduced in the presence of a gaseous reducing agent (e.g., hydrogen). Additional details of such a reduction reaction may be described in WO 2014/199480 to Maeshima, et al. After the reduction, the product may be cooled, crushed, and washed to form a powder.

The specific charge of the powder typically varies from about 2,000 to about 800,000 microFarads*Volts per gram ("µF*V/g") depending on the desired application. For instance, in certain embodiments, a high charge powder may be employed that has a specific charge of from about 100,000 to about 800,000 µF*V/g, in some embodiments from about 120,000 to about 700,000 µF*V/g, and in some embodiments, from about 150,000 to about 600,000 µF*V/g. In other embodiments, a low charge powder may be employed that has a specific charge of from about 2,000 to about 100,000 µF*V/g, in some embodiments from about 5,000 to about 80,000 µF*V/g, and in some embodiments, from about 10,000 to about 70,000 µF*V/g. As is known in the art, the specific charge may be determined by multiplying capacitance by the anodizing voltage employed, and then dividing this product by the weight of the anodized electrode body.

The powder may be a free-flowing, finely divided powder that contains primary particles. The primary particles of the powder generally have a median size (D50) of from about 5 to about 500 nanometers, in some embodiments from about 10 to about 400 nanometers, and in some embodiments, from about 20 to about 250 nanometers, such as determined using a laser particle size distribution analyzer made by BECKMAN COULTER Corporation (e.g., LS-230), optionally after subjecting the particles to an ultrasonic wave vibration of 70 seconds. The primary particles typically have a three-dimensional granular shape (e.g., nodular or angular). Such particles typically have a relatively low "aspect ratio", which is the average diameter or width of the particles divided by the average thickness ("D/T"). For example, the aspect ratio of the particles may be about 4 or less, in some embodiments about 3 or less, and in some embodiments, from about 1 to about 2. In addition to primary particles, the powder may also contain other types of particles, such as secondary particles formed by aggregating (or agglomerating) the primary particles. Such secondary particles may have a median size (D50) of from about 1 to about 500 micrometers, and in some embodiments, from about 10 to about 250 micrometers.

Agglomeration of the particles may occur by heating the particles and/or through the use of a binder. For example, agglomeration may occur at a temperature of from about 0° C. to about 40° C., in some embodiments from about 5° C. to about 35° C., and in some embodiments, from about 15° C. to about 30° C. Suitable binders may likewise include, for instance, poly(vinyl butyral); poly(vinyl acetate); poly(vinyl alcohol); poly(vinyl pyrollidone); cellulosic polymers, such as carboxymethylcellulose, methyl cellulose, ethyl cellulose, hydroxyethyl cellulose, and methylhydroxyethyl cellulose; atactic polypropylene, polyethylene; polyethylene glycol (e.g., Carbowax from Dow Chemical Co.); polystyrene, poly(butadiene/styrene); polyamides, polyimides, and polyacrylamides, high molecular weight polyethers; copolymers of ethylene oxide and propylene oxide; fluoropolymers, such as polytetrafluoroethylene, polyvinylidene fluoride, and fluoro-olefin copolymers; acrylic polymers, such as sodium polyacrylate, poly(lower alkyl acrylates), poly(lower alkyl methacrylates) and copolymers of lower alkyl acrylates and methacrylates; and fatty acids and waxes, such as stearic and other soapy fatty acids, vegetable wax, microwaxes (purified paraffins), etc.

The resulting powder may be compacted to form a pellet using any conventional powder press device. For example, a press mold may be employed that is a single station compaction press containing a die and one or multiple punches. Alternatively, anvil-type compaction press molds may be used that use only a die and single lower punch. Single station compaction press molds are available in several basic types, such as cam, toggle/knuckle and eccentric/crank presses with varying capabilities, such as single action, double action, floating die, movable platen, opposed ram, screw, impact, hot pressing, coining or sizing. The powder may be compacted around an anode lead, which may be in the form of a wire, sheet, etc. The lead may extend in a longitudinal direction from the anode body and may be formed from any electrically conductive material, such as tantalum, niobium, aluminum, hafnium, titanium, etc., as well as electrically conductive oxides and/or nitrides of thereof. Connection of the lead may also be accomplished using other known techniques, such as by welding the lead to the body or embedding it within the anode body during formation (e.g., prior to compaction and/or sintering).

Any binder may be removed after pressing by heating the pellet under vacuum at a certain temperature (e.g., from about 150° C. to about 500° C.) for several minutes. Alternatively, the binder may also be removed by contacting the pellet with an aqueous solution, such as described in U.S. Pat. No. 6,197,252 to Bishop, et al. Thereafter, the pellet is sintered to form a porous, integral mass. The pellet is typically sintered at a temperature of from about 700° C. to about 1600° C., in some embodiments from about 800° C. to about 1500° C., and in some embodiments, from about 900° C. to about 1200° C., for a time of from about 5 minutes to about 100 minutes, and in some embodiments, from about 8 minutes to about 15 minutes. This may occur in one or more steps. If desired, sintering may occur in an atmosphere that limits the transfer of oxygen atoms to the anode. For example, sintering may occur in a reducing atmosphere, such as in a vacuum, inert gas, hydrogen, etc. The reducing atmosphere may be at a pressure of from about 10 Torr to about 2000 Torr, in some embodiments from about 100 Torr to about 1000 Torr, and in some embodiments, from about 100 Torr to about 930 Torr. Mixtures of hydrogen and other gases (e.g., argon or nitrogen) may also be employed.

B. Dielectric

The anode is also coated with a dielectric. The dielectric may be formed by anodically oxidizing ("anodizing") the sintered anode so that a dielectric layer is formed over and/or within the anode. For example, a tantalum (Ta) anode may be anodized to tantalum pentoxide ($Ta_2O_5$). Typically, anodization is performed by initially applying a solution to the anode, such as by dipping anode into the electrolyte. A solvent is generally employed, such as water (e.g., deionized water). To enhance ionic conductivity, a compound may be employed that is capable of dissociating in the solvent to form ions. Examples of such compounds include, for instance, acids, such as described below with respect to the electrolyte. For example, an acid (e.g., phosphoric acid) may constitute from about 0.01 wt. % to about 5 wt. %, in some embodiments from about 0.05 wt. % to about 0.8 wt. %, and in some embodiments, from about 0.1 wt. % to about 0.5 wt. % of the anodizing solution. If desired, blends of acids may also be employed.

A current is passed through the anodizing solution to form the dielectric layer. The value of the formation voltage manages the thickness of the dielectric layer. For example, the power supply may be initially set up at a galvanostatic mode until the required voltage is reached. Thereafter, the power supply may be switched to a potentiostatic mode to ensure that the desired dielectric thickness is formed over the entire surface of the anode. Of course, other known methods may also be employed, such as pulse or step potentiostatic methods. The voltage at which anodic oxidation occurs typically ranges from about 4 to about 250 V, and in some embodiments, from about 5 to about 200 V, and in some embodiments, from about 10 to about 150 V. During oxidation, the anodizing solution can be kept at an elevated temperature, such as about 30° C. or more, in some embodiments from about 40° C. to about 200° C., and in some embodiments, from about 50° C. to about 100° C. Anodic oxidation can also be done at ambient temperature or lower. The resulting dielectric layer may be formed on a surface of the anode and within its pores.

Although not required, in certain embodiments, the dielectric layer may possess a differential thickness throughout the anode in that it possesses a first portion that overlies an external surface of the anode and a second portion that overlies an interior surface of the anode. In such embodiments, the first portion is selectively formed so that its thickness is greater than that of the second portion. It should be understood, however, that the thickness of the dielectric layer need not be uniform within a particular region. Certain portions of the dielectric layer adjacent to the external surface may, for example, actually be thinner than certain portions of the layer at the interior surface, and vice versa. Nevertheless, the dielectric layer may be formed such that at least a portion of the layer at the external surface has a greater thickness than at least a portion at the interior surface. Although the exact difference in these thicknesses may vary depending on the particular application, the ratio of the thickness of the first portion to the thickness of the second portion is typically from about 1.2 to about 40, in some embodiments from about 1.5 to about 25, and in some embodiments, from about 2 to about 20.

To form a dielectric layer having a differential thickness, a multi-stage process is generally employed. In each stage of the process, the sintered anode is anodically oxidized ("anodized") to form a dielectric layer (e.g., tantalum pentoxide). During the first stage of anodization, a relatively small forming voltage is typically employed to ensure that the desired dielectric thickness is achieved for the inner region, such as forming voltages ranging from about 1 to about 90 volts, in some embodiments from about 2 to about 50 volts, and in some embodiments, from about 5 to about 20 volts. Thereafter, the sintered body may then be anodically oxidized in a second stage of the process to increase the thickness of the dielectric to the desired level. This is generally accomplished by anodizing in an electrolyte at a higher voltage than employed during the first stage, such as at forming voltages ranging from about 50 to about 350 volts, in some embodiments from about 60 to about 300 volts, and in some embodiments, from about 70 to about 200 volts. During the first and/or second stages, the electrolyte may be kept at a temperature within the range of from about 15° C. to about 95° C., in some embodiments from about 20° C. to about 90° C., and in some embodiments, from about 25° C. to about 85° C.

The electrolytes employed during the first and second stages of the anodization process may be the same or different. Typically, however, it is desired to employ different solutions to help better facilitate the attainment of a higher thickness at the outer portions of the dielectric layer. For example, it may be desired that the electrolyte employed in the second stage has a lower ionic conductivity than the electrolyte employed in the first stage to prevent a significant amount of oxide film from forming on the internal surface of anode. In this regard, the electrolyte employed during the first stage may contain an acidic compound, such as hydrochloric acid, nitric acid, sulfuric acid, phosphoric acid, polyphosphoric acid, boric acid, boronic acid, etc. Such an electrolyte may have an electrical conductivity of from about 0.1 to about 100 mS/cm, in some embodiments from about 0.2 to about 20 mS/cm, and in some embodiments, from about 1 to about 10 mS/cm, determined at a temperature of 25° C. The electrolyte employed during the second stage typically contains a salt of a weak acid so that the hydronium ion concentration increases in the pores as a result of charge passage therein. Ion transport or diffusion is such that the weak acid anion moves into the pores as necessary to balance the electrical charges. As a result, the concentration of the principal conducting species (hydronium ion) is reduced in the establishment of equilibrium between the hydronium ion, acid anion, and undissociated acid, thus forms a poorer-conducting species. The reduction in the concentration of the conducting species results in a relatively high voltage drop in the electrolyte, which hinders further anodization in the interior while a thicker oxide layer, is being built up on the outside to a higher formation voltage in the region of continued high conductivity. Suitable weak acid salts may include, for instance, ammonium or alkali metal salts (e.g., sodium, potassium, etc.) of boric acid, boronic acid, acetic acid, oxalic acid, lactic acid, adipic acid, etc. Particularly suitable salts include sodium tetraborate and ammonium pentaborate. Such electrolytes typically have an electrical conductivity of from about 0.1 to about 20 mS/cm, in some embodiments from about 0.5 to about 10 mS/cm, and in some embodiments, from about 1 to about 5 mS/cm, determined at a temperature of 25° C.

If desired, each stage of anodization may be repeated for one or more cycles to achieve the desired dielectric thickness. Furthermore, the anode may also be rinsed or washed with another solvent (e.g., water) after the first and/or second stages to remove the electrolyte.

C. Solid Electrolyte

As indicated above, a solid electrolyte overlies the dielectric and generally functions as the cathode for the capacitor assembly. The solid electrolyte may include materials such as conductive polymers (e.g., polypyrroles, polythiophenes, polyanilines, etc.). The conductive polymer is typically π-conjugated and has electrical conductivity after oxidation or reduction, such as an electrical conductivity of at least about 1 µS/cm. Examples of such π-conjugated conductive polymers include, for instance, polyheterocycles (e.g., polypyrroles, polythiophenes, polyanilines, etc.), polyacetylenes, poly-p-phenylenes, polyphenolates, and so forth. In one embodiment, for example, the polymer is a substituted polythiophene, such as those having the following general structure:

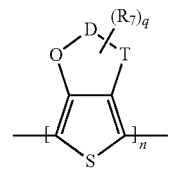

wherein,

T is O or S;

D is an optionally substituted $C_1$ to $C_5$ alkylene radical (e.g., methylene, ethylene, n-propylene, n-butylene, n-pentylene, etc.);

$R_7$ is a linear or branched, optionally substituted $C_1$ to $C_{18}$ alkyl radical (e.g., methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl, n-octadecyl, etc.); optionally substituted $C_5$ to $C_{12}$ cycloalkyl radical (e.g., cyclopentyl, cyclohexyl, cycloheptyl, cyclooctyl, cyclononyl cyclodecyl, etc.); optionally substituted $C_6$ to $C_{14}$ aryl radical (e.g., phenyl, naphthyl, etc.); optionally substituted $C_7$ to $C_{18}$ aralkyl radical (e.g., benzyl, o-, m-, p-tolyl, 2,3-, 2,4-, 2,5-, 2-6, 3-4-, 3,5-xylyl, mesityl, etc.); optionally substituted $C_1$ to $C_4$ hydroxyalkyl radical, or hydroxyl radical; and q is an integer from 0 to 8, in some embodiments, from 0 to 2, and in one embodiment, 0; and n is from 2 to 5,000, in some embodiments from 4 to 2,000, and in some embodiments, from 5 to 1,000. Example of substituents for the radicals "D" or "$R_7$" include, for instance, alkyl, cycloalkyl, aryl, aralkyl, alkoxy, halogen, ether, thioether, disulphide, sulfoxide, sulfone, sulfonate, amino, aldehyde, keto, carboxylic acid ester, carboxylic acid, carbonate, carboxylate, cyano, alkylsilane and alkoxysilane groups, carboxylamide groups, and so forth.

Particularly suitable thiophene polymers are those in which "D" is an optionally substituted $C_2$ to $C_3$ alkylene radical. For instance, the polymer may be optionally substituted poly(3,4-ethylenedioxythiophene), which has the following general structure:

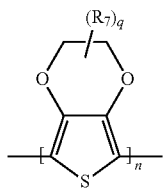

Methods for forming conductive polymers, such as described above, are well known in the art. For instance, U.S. Pat. No. 6,987,663 to Merker, et al., describes various techniques for forming substituted polythiophenes from a monomeric precursor. The monomeric precursor may, for instance, have the following structure:

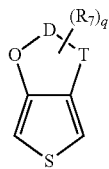

wherein,

T, D, $R_7$, and q are defined above. Particularly suitable thiophene monomers are those in which "D" is an optionally substituted $C_2$ to $C_3$ alkylene radical. For instance, optionally substituted 3,4-alkylenedioxythiophenes may be employed that have the general structure:

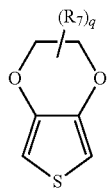

wherein, $R_7$ and q are as defined above. In one particular embodiment, "q" is 0. One commercially suitable example of 3,4-ethylenedioxythiophene is available from Heraeus Clevios under the designation Clevios™ M. Other suitable monomers are also described in U.S. Pat. No. 5,111,327 to Blohm, et al. and U.S. Pat. No. 6,635,729 to Groenendaal, et al. Derivatives of these monomers may also be employed that are, for example, dimers or trimers of the above monomers. Higher molecular derivatives, i.e., tetramers, pentamers, etc. of the monomers are suitable for use in the present invention. The derivatives may be made up of identical or different monomer units and used in pure form and in a mixture with one another and/or with the monomers. Oxidized or reduced forms of these precursors may also be employed.

Various methods may be utilized to form the conductive polymer layer. For example, an in situ polymerized layer may be formed by chemically polymerizing monomers in the presence of an oxidative catalyst. The oxidative catalyst typically includes a transition metal cation, such as iron(III), copper(II), chromium(VI), cerium(IV), manganese(IV), manganese(VII), or ruthenium(III) cations, and etc. A dopant may also be employed to provide excess charge to the conductive polymer and stabilize the conductivity of the polymer. The dopant typically includes an inorganic or organic anion, such as an ion of a sulfonic acid. In certain embodiments, the oxidative catalyst has both a catalytic and doping functionality in that it includes a cation (e.g., transition metal) and an anion (e.g., sulfonic acid). For example, the oxidative catalyst may be a transition metal salt that includes iron(III) cations, such as iron(III) halides (e.g., $FeCl_3$) or iron(III) salts of other inorganic acids, such as $Fe(ClO_4)_3$ or $Fe_2(SO_4)_3$ and the iron(III) salts of organic acids and inorganic acids comprising organic radicals. Examples of iron (III) salts of inorganic acids with organic radicals include, for instance, iron(III) salts of sulfuric acid monoesters of $C_1$ to $C_{20}$ alkanols (e.g., iron(III) salt of lauryl sulfate). Likewise, examples of iron(III) salts of organic acids include, for instance, iron(III) salts of $C_1$ to $C_{20}$ alkane sulfonic acids (e.g., methane, ethane, propane, butane, or dodecane sulfonic acid); iron (III) salts of aliphatic perfluorosulfonic acids (e.g., trifluoromethane sulfonic acid, perfluorobutane sulfonic acid, or perfluorooctane sulfonic acid); iron (III) salts of aliphatic $C_1$ to $C_{20}$ carboxylic acids (e.g., 2-ethylhexylcarboxylic acid); iron (III) salts of aliphatic perfluorocarboxylic acids (e.g., trifluoroacetic acid or perfluorooctane acid); iron (III) salts of aromatic sulfonic acids optionally substituted by $C_1$ to $C_{20}$ alkyl groups (e.g., benzene sulfonic acid, o-toluene sulfonic acid, p-toluene sulfonic acid, or dodecylbenzene sulfonic acid); iron (III) salts of cycloalkane sulfonic acids (e.g., camphor sulfonic acid); and so forth. Mixtures of these above-mentioned iron(III) salts may also be used. Iron(III)-p-toluene sulfonate, iron(III)-o-toluene sulfonate, and mixtures thereof, are particularly suitable. One commercially suitable example of iron(III)-p-toluene sulfonate is available from Heraeus Clevios under the designation Clevios™ C.

The oxidative catalyst and monomer may be applied either sequentially or together to initiate the polymerization reaction. Suitable application techniques for applying these components include screen-printing, dipping, electrophoretic coating, and spraying. As an example, the monomer may initially be mixed with the oxidative catalyst to form a precursor solution. Once the mixture is formed, it may be applied to the anode part and then allowed to polymerize so that a conductive coating is formed on the surface. Alternatively, the oxidative catalyst and monomer may be applied sequentially. In one embodiment, for example, the oxidative catalyst is dissolved in an organic solvent (e.g., butanol) and then applied as a dipping solution. The anode part may then be dried to remove the solvent therefrom. Thereafter, the part may be dipped into a solution containing the monomer. Regardless, polymerization is typically performed at temperatures of from about −10° C. to about 250° C., and in some embodiments, from about 0° C. to about 200° C., depending on the oxidizing agent used and desired reaction time. Suitable polymerization techniques, such as described above, may be described in more detail in U.S. Pat. No. 7,515,396 to Biler. Still other methods for applying such conductive coating(s) may be described in U.S. Pat. No. 5,457,862 to Sakata, et al., U.S. Pat. No. 5,473,503 to Sakata, et al., U.S. Pat. No. 5,729,428 to Sakata, et al., and U.S. Pat. No. 5,812,367 to Kudoh, et al.

In addition to in situ application, the conductive polymer solid electrolyte may also be applied in the form of a dispersion of conductive polymer particles. One benefit of employing such particles is that they can minimize the presence of ionic species (e.g., $Fe^{2+}$ or $Fe^{3+}$) produced during conventional in situ polymerization processes, which can cause dielectric breakdown under high electric field due to ionic migration. Thus, by applying the conductive polymer as pre-polymerized particles rather through in situ polymerization, the resulting capacitor may exhibit a relatively high "breakdown voltage." If desired, the solid electrolyte may be formed from one or multiple layers. When multiple layers are employed, it is possible that one or more of the layers includes a conductive polymer formed by in situ polymerization. Regardless of the number of layers employed, the resulting solid electrolyte typically has a total a thickness of from about 1 micrometer (μm) to about 200 μm, in some embodiments from about 2 μm to about 50 μm, and in some embodiments, from about 5 μm to about 30 μm.

Thiophene polymers are particularly suitable for use in the solid electrolyte. In certain embodiments, for instance, an "extrinsically" conductive thiophene polymer may be employed in the solid electrolyte that has repeating units of the following structure:

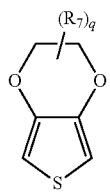

wherein, $R_7$ is a linear or branched, $C_1$ to $C_{18}$ alkyl radical (e.g., methyl, ethyl, n- or iso-propyl, n-, iso-, sec- or tert-butyl, n-pentyl, 1-methylbutyl, 2-methylbutyl, 3-methylbutyl, 1-ethylpropyl, 1,1-dimethylpropyl, 1,2-dimethylpropyl, 2,2-dimethylpropyl, n-hexyl, n-heptyl, n-octyl, 2-ethylhexyl, n-nonyl, n-decyl, n-undecyl, n-dodecyl, n-tridecyl, n-tetradecyl, n-hexadecyl, n-octadecyl, etc.); $C_5$ to $C_{12}$ cycloalkyl radical (e.g., cyclopentyl, cyclohexyl, cycloheptyl, cyclooctyl, cyclononyl, cyclodecyl, etc.); $C_6$ to $C_{14}$ aryl radical (e.g., phenyl, naphthyl, etc.); $C_7$ to $C_{18}$ aralkyl radical (e.g., benzyl, o-, m-, p-tolyl, 2,3-, 2,4-, 2,5-, 2-6, 3-4-, 3,5-xylyl, mesityl, etc.); and q is an integer from 0 to 8, in some embodiments, from 0 to 2, and in one embodiment, 0. In one particular embodiment, "q" is 0 and the polymer is poly(3,4-ethylenedioxythiophene). One commercially suitable example of a monomer suitable for forming such a polymer is 3,4-ethylenedioxythiophene, which is available from Heraeus under the designation Clevios™ M.

These polymers are generally considered to be "extrinsically" conductive to the extent that they typically require the presence of a separate counterion that is not covalently bound to the polymer. The counterion may be a monomeric or polymeric anion that counteracts the charge of the conductive polymer. Polymeric anions can, for example, be anions of polymeric carboxylic acids (e.g., polyacrylic acids, polymethacrylic acid, polymaleic acids, etc.); polymeric sulfonic acids (e.g., polystyrene sulfonic acids ("PSS"), polyvinyl sulfonic acids, etc.); and so forth. The acids may also be copolymers, such as copolymers of vinyl carboxylic and vinyl sulfonic acids with other polymerizable monomers, such as acrylic acid esters and styrene. Likewise, suitable monomeric anions include, for example, anions of $C_1$ to $C_{20}$ alkane sulfonic acids (e.g., dodecane sulfonic acid); aliphatic perfluorosulfonic acids (e.g., trifluoromethane sulfonic acid, perfluorobutane sulfonic acid or perfluorooctane sulfonic acid); aliphatic $C_1$ to $C_{20}$ carboxylic acids (e.g., 2-ethyl-hexylcarboxylic acid); aliphatic perfluorocarboxylic acids (e.g., trifluoroacetic acid or perfluorooctanoic acid); aromatic sulfonic acids optionally substituted by $C_1$ to $C_{20}$ alkyl groups (e.g., benzene sulfonic acid, o-toluene sulfonic acid, p-toluene sulfonic acid or dodecylbenzene sulfonic acid); cycloalkane sulfonic acids (e.g., camphor sulfonic acid or tetrafluoroborates, hexafluorophosphates, perchlorates, hexafluoroantimonates, hexafluoroarsenates or hexachloroantimonates); and so forth. Particularly suitable counteranions are polymeric anions, such as a polymeric carboxylic or sulfonic acid (e.g., polystyrene sulfonic acid ("PSS")). The molecular weight of such polymeric anions typically ranges from about 1,000 to about 2,000,000, and in some embodiments, from about 2,000 to about 500,000.

Intrinsically conductive polymers may also be employed that have a positive charge located on the main chain that is at least partially compensated by anions covalently bound to the polymer. For example, one example of a suitable intrinsically conductive thiophene polymer may have repeating units of the following structure:

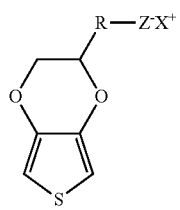

wherein,

R is $(CH_2)_a$—O—$(CH_2)_b$;

a is from 0 to 10, in some embodiments from 0 to 6, and in some embodiments, from 1 to 4 (e.g., 1);

b is from 1 to 18, in some embodiments from 1 to 10, and in some embodiments, from 2 to 6 (e.g., 2, 3, 4, or 5);

Z is an anion, such as $SO_3^+$, $C(O)O^-$, $BF_4^+$, $CF_3SO_3^-$, $SbF_6^-$, $N(SO_2CF_3)_2$; $C_4H_3O_4^-$, $ClO_4^-$, etc.;

X is a cation, such as hydrogen, an alkali metal (e.g., lithium, sodium, rubidium, cesium or potassium), ammonium, etc.

In one particular embodiment, Z in formula (IV) is a sulfonate ion such that the intrinsically conductive polymer contains repeating units of the following structure:

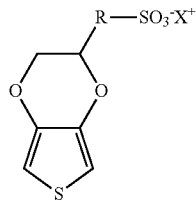

wherein, R and X are defined above. In latter two structures, a is preferably 1 and b is preferably 3 or 4. Likewise, X is preferably sodium or potassium.

If desired, the polymer may be a copolymer that contains other types of repeating units. In such embodiments, the repeating units of formula (IV) typically constitute about 50 mol. % or more, in some embodiments from about 75 mol. % to about 99 mol. %, and in some embodiments, from about 85 mol. % to about 95 mol. % of the total amount of repeating units in the copolymer. Of course, the polymer may also be a homopolymer to the extent that it contains 100 mol. % of the repeating units of formula (IV). Specific examples of such homopolymers include poly(4-(2,3-dihydrothieno-[3,4-b][1,4]dioxin-2-ylmethoxy)-1-butane-sulphonic acid, salt) and poly(4-(2,3-dihydrothieno-[3,4-b][1,4]dioxin-2-ylmethoxy)-1-propanesulphonic acid, salt).

Regardless of the particular nature of the polymer, the resulting conductive polymer particles typically have an average size (e.g., diameter) of from about 1 to about 80 nanometers, in some embodiments from about 2 to about 70 nanometers, and in some embodiments, from about 3 to about 60 nanometers. The diameter of the particles may be determined using known techniques, such as by ultracentrifuge, laser diffraction, etc. The shape of the particles may likewise vary. In one particular embodiment, for instance, the particles are spherical in shape. However, it should be understood that other shapes are also contemplated by the present invention, such as plates, rods, discs, bars, tubes, irregular shapes, etc.

Although not necessarily required, the conductive polymer particles may be applied in the form of a dispersion. The concentration of the conductive polymer in the dispersion may vary depending on the desired viscosity of the dispersion and the particular manner in which the dispersion is to be applied to the capacitor element. Typically, however, the polymer constitutes from about 0.1 to about 10 wt. %, in some embodiments from about 0.4 to about 5 wt. %, and in some embodiments, from about 0.5 to about 4 wt. % of the dispersion. The dispersion may also contain one or more components to enhance the overall properties of the resulting solid electrolyte. For example, the dispersion may contain a binder to further enhance the adhesive nature of the polymeric layer and also increase the stability of the particles within the dispersion. The binder may be organic in nature, such as polyvinyl alcohols, polyvinyl pyrrolidones, polyvinyl chlorides, polyvinyl acetates, polyvinyl butyrates, polyacrylic acid esters, polyacrylic acid amides, polymethacrylic acid esters, polymethacrylic acid amides, polyacrylonitriles, styrene/acrylic acid ester, vinyl acetate/acrylic acid ester and ethylene/vinyl acetate copolymers, polybutadienes, polyisoprenes, polystyrenes, polyethers, polyesters, polycarbonates, polyurethanes, polyamides, polyimides, polysulfones, melamine formaldehyde resins, epoxide resins, silicone resins or celluloses. Crosslinking agents may also be employed to enhance the adhesion capacity of the binders. Such crosslinking agents may include, for instance, melamine compounds, masked isocyanates or crosslinkable polymers, such as polyurethanes, polyacrylates or polyolefins, and subsequent crosslinking. Dispersion agents may also be employed to facilitate the ability to apply the layer to the anode. Suitable dispersion agents include solvents, such as aliphatic alcohols (e.g., methanol, ethanol, i-propanol and butanol), aliphatic ketones (e.g., acetone and methyl ethyl ketones), aliphatic carboxylic acid esters (e.g., ethyl acetate and butyl acetate), aromatic hydrocarbons (e.g., toluene and xylene), aliphatic hydrocarbons (e.g., hexane, heptane and cyclohexane), chlorinated hydrocarbons (e.g., dichloromethane and dichloroethane), aliphatic nitriles (e.g., acetonitrile), aliphatic sulfoxides and sulfones (e.g., dimethyl sulfoxide and sulfolane), aliphatic carboxylic acid amides (e.g., methylacetamide, dimethylacetamide and dimethylformamide), aliphatic and araliphatic ethers (e.g., diethylether and anisole), water, and mixtures of any of the foregoing solvents. A particularly suitable dispersion agent is water.

In addition to those mentioned above, still other ingredients may also be used in the dispersion. For example, conventional fillers may be used that have a size of from about 10 nanometers to about 100 micrometers, in some embodiments from about 50 nanometers to about 50 micrometers, and in some embodiments, from about 100 nanometers to about 30 micrometers. Examples of such fillers include calcium carbonate, silicates, silica, calcium or barium sulfate, aluminum hydroxide, glass fibers or bulbs, wood flour, cellulose powder carbon black, electrically conductive polymers, etc. The fillers may be introduced into the dispersion in powder form, but may also be present in another form, such as fibers.

Surface-active substances may also be employed in the dispersion, such as ionic or non-ionic surfactants. Furthermore, adhesives may be employed, such as organofunctional silanes or their hydrolysates, for example 3-glycidoxypropyltrialkoxysilane, 3-aminopropyl-triethoxysilane, 3-mercaptopropyltrimethoxysilane, 3-metacryloxypropyltrimethoxysilane, vinyltrimethoxysilane or octyltriethoxysilane. The dispersion may also contain additives that increase conductivity, such as ether group-containing compounds (e.g., tetrahydrofuran), lactone group-containing compounds (e.g., γ-butyrolactone or γ-valerolactone), amide or lactam group-containing compounds (e.g., caprolactam, N-methylcaprolactam, N,N-dimethylacetamide, N-methylacetamide, N,N-dimethylformamide (DMF), N-methylformamide, N-methylformanilide, N-methylpyrrolidone (NMP), N-octylpyrrolidone, or pyrrolidone), sulfones and sulfoxides (e.g., sulfolane (tetramethylenesulfone) or dimethylsulfoxide (DMSO)), sugar or sugar derivatives (e.g., saccharose, glucose, fructose, or lactose), sugar alcohols (e.g., sorbitol or mannitol), furan derivatives (e.g., 2-furancarboxylic acid or 3-furancarboxylic acid), an alcohols (e.g., ethylene glycol, glycerol, di- or triethylene glycol).

The dispersion may be applied using a variety of known techniques, such as by spin coating, impregnation, pouring, dropwise application, injection, spraying, doctor blading, brushing, printing (e.g., ink-jet, screen, or pad printing), or dipping. The viscosity of the dispersion is typically from about 0.1 to about 100,000 mPas (measured at a shear rate of 100 s$^{-1}$), in some embodiments from about 1 to about 10,000 mPas, in some embodiments from about 10 to about 1,500 mPas, and in some embodiments, from about 100 to about 1000 mPas.

D. External Polymer Coating

An external polymer coating may also overly the solid electrolyte. The external polymer coating generally contains one or more layers formed from pre-polymerized conductive polymer particles such as described above (e.g., dispersion of extrinsically conductive polymer particles). The external coating may be able to further penetrate into the edge region of the capacitor body to increase the adhesion to the dielectric and result in a more mechanically robust part, which may reduce equivalent series resistance and leakage current. Because it is generally intended to improve the degree of edge coverage rather to impregnate the interior of the anode body, the particles used in the external coating typically have a larger size than those employed in the solid electrolyte. For example, the ratio of the average size of the particles employed in the external polymer coating to the average size of the particles employed in any dispersion of the solid electrolyte is typically from about 1.5 to about 30, in some embodiments from about 2 to about 20, and in some embodiments, from about 5 to about 15. For example, the particles employed in the dispersion of the external coating may have an average size of from about 80 to about 500 nanometers, in some embodiments from about 90 to about 250 nanometers, and in some embodiments, from about 100 to about 200 nanometers.

If desired, a crosslinking agent may also be employed in the external polymer coating to enhance the degree of adhesion to the solid electrolyte. Typically, the crosslinking agent is applied prior to application of the dispersion used in the external coating. Suitable crosslinking agents are described, for instance, in U.S. Patent Publication No. 2007/0064376 to Merker, et al. and include, for instance, amines (e.g., diamines, triamines, oligomer amines, polyamines, etc.); polyvalent metal cations, such as salts or compounds of Mg, Al, Ca, Fe, Cr, Mn, Ba, Ti, Co, Ni, Cu, Ru, Ce or Zn, phosphonium compounds, sulfonium compounds, etc. Particularly suitable examples include, for instance, 1,4-diaminocyclohexane, 1,4-bis(amino-methyl)cyclohexane, ethylenediamine, 1,6-hexanediamine, 1,7-heptanediamine, 1,8-octanediamine, 1,9-nonanediamine, 1,10-decanediamine, 1,12-dodecanediamine, N,N-dimethylethylenediamine, N,N,N',N'-tetramethylethylenediamine, N,N,N',N'-tetramethyl-1,4-butanediamine, etc., as well as mixtures thereof.

The crosslinking agent is typically applied from a solution or dispersion whose pH is from 1 to 10, in some embodiments from 2 to 7, in some embodiments, from 3 to 6, as determined at 25° C. Acidic compounds may be employed to help achieve the desired pH level. Examples of solvents or dispersants for the crosslinking agent include water or organic solvents, such as alcohols, ketones, carboxylic esters, etc. The crosslinking agent may be applied to the capacitor body by any known process, such as spin-coating, impregnation, casting, dropwise application, spray application, vapor deposition, sputtering, sublimation, knife-coating, painting or printing, for example inkjet, screen or pad printing. Once applied, the crosslinking agent may be dried prior to application of the polymer dispersion. This process may then be repeated until the desired thickness is achieved. For example, the total thickness of the entire external polymer coating, including the crosslinking agent and dispersion layers, may range from about 1 to about 50 µm, in some embodiments from about 2 to about 40 µm, and in some embodiments, from about 5 to about 20 µm.

E. Cathode Coating

If desired, the capacitor element may also employ a cathode coating that overlies the solid electrolyte and other optional layers (e.g., external polymer coating). The cathode coating may contain a metal particle layer includes a plurality of conductive metal particles dispersed within a resinous polymer matrix. The particles typically constitute from about 50 wt. % to about 99 wt. %, in some embodiments from about 60 wt. % to about 98 wt. %, and in some embodiments, from about 70 wt. % to about 95 wt. % of the layer, while the resinous polymer matrix typically constitutes from about 1 wt. % to about 50 wt. %, in some embodiments from about 2 wt. % to about 40 wt. %, and in some embodiments from about 5 wt. % to about 30 wt. % of the layer.

The conductive metal particles may be formed from a variety of different metals, such as copper, nickel, silver, nickel, zinc, tin, lead, copper, aluminum, molybdenum, titanium, iron, zirconium, magnesium, etc., as well as alloys thereof. Silver is a particularly suitable conductive metal for use in the layer. The metal particles often have a relatively small size, such as an average size of from about 0.01 to about 50 micrometers, in some embodiments from about 0.1 to about 40 micrometers, and in some embodiments, from about 1 to about 30 micrometers. Typically, only one metal particle layer is employed, although it should be understood that multiple layers may be employed if so desired. The total thickness of such layer(s) is typically within the range of from about 1 µm to about 500 µm, in some embodiments from about 5 µm to about 200 µm, and in some embodiments, from about 10 µm to about 100 µm.

The resinous polymer matrix typically includes a polymer, which may be thermoplastic or thermosetting in nature. Typically, however, the polymer is selected so that it can act as a barrier to electromigration of silver ions, and also so that it contains a relatively small amount of polar groups to minimize the degree of water adsorption in the cathode coating. In this regard, the present inventors have found that vinyl acetal polymers are particularly suitable for this purpose, such as polyvinyl butyral, polyvinyl formal, etc. Polyvinyl butyral, for instance, may be formed by reacting polyvinyl alcohol with an aldehyde (e.g., butyraldehyde). Because this reaction is not typically complete, polyvinyl butyral will generally have a residual hydroxyl content. By minimizing this content, however, the polymer can possess a lesser degree of strong polar groups, which would otherwise result in a high degree of moisture adsorption and result in silver ion migration. For instance, the residual hydroxyl content in polyvinyl acetal may be about 35 mol. % or less, in some embodiments about 30 mol. % or less, and in some embodiments, from about 10 mol. % to about 25 mol. %. One commercially available example of such a polymer is available from Sekisui Chemical Co., Ltd. under the designation "BH-S" (polyvinyl butyral).

To form the cathode coating, a conductive paste is typically applied to the capacitor that overlies the solid electrolyte. One or more organic solvents are generally employed in the paste. A variety of different organic solvents may generally be employed, such as glycols (e.g., propylene glycol, butylene glycol, triethylene glycol, hexylene glycol, polyethylene glycols, ethoxydiglycol, and dipropyleneglycol); glycol ethers (e.g., methyl glycol ether, ethyl glycol ether, and isopropyl glycol ether); ethers (e.g., diethyl ether and tetrahydrofuran); alcohols (e.g., benzyl alcohol, methanol, ethanol, n-propanol, iso-propanol, and butanol); triglycerides; ketones (e.g., acetone, methyl ethyl ketone, and methyl isobutyl ketone); esters (e.g., ethyl acetate, butyl acetate, diethylene glycol ether acetate, and methoxypropyl acetate); amides (e.g., dimethylformamide, dimethylacetamide, dimethylcaprylic/capric fatty acid amide and N-alkylpyrrolidones); nitriles (e.g., acetonitrile, propionitrile, butyronitrile and benzonitrile); sulfoxides or sulfones (e.g., dimethyl sulfoxide (DMSO) and sulfolane); etc., as well as mixtures thereof. The organic solvent(s) typically constitute from about 10 wt. % to about 70 wt. %, in some embodiments from about 20 wt. % to about 65 wt. %, and in some embodiments, from about 30 wt. % to about 60 wt. %. of the paste. Typically, the metal particles constitute from about 10 wt. % to about 60 wt. %, in some embodiments from about 20 wt. % to about 45 wt. %, and in some embodiments, from about 25 wt. % to about 40 wt. % of the paste, and the resinous polymer matrix constitutes from about 0.1 wt. % to about 20 wt. %, in some embodiments from about 0.2 wt. % to about 10 wt. %, and in some embodiments, from about 0.5 wt. % to about 8 wt. % of the paste.

The paste may have a relatively low viscosity, allowing it to be readily handled and applied to a capacitor element. The viscosity may, for instance, range from about 50 to about 3,000 centipoise, in some embodiments from about 100 to about 2,000 centipoise, and in some embodiments, from about 200 to about 1,000 centipoise, such as measured with a Brookfield DV-1 viscometer (cone and plate) operating at a speed of 10 rpm and a temperature of 25° C. If desired, thickeners or other viscosity modifiers may be employed in the paste to increase or decrease viscosity. Further, the thickness of the applied paste may also be relatively thin and still achieve the desired properties. For example, the thickness of the paste may be from about 0.01 to about 50 micrometers, in some embodiments from about 0.5 to about 30 micrometers, and in some embodiments, from about 1 to about 25 micrometers. Once applied, the metal paste may be optionally dried to remove certain components, such as the organic solvents. For instance, drying may occur at a temperature of from about 20° C. to about 150° C., in some embodiments from about 50° C. to about 140° C., and in some embodiments, from about 80° C. to about 130° C.

F. Other Components

If desired, the capacitor may also contain other layers as is known in the art. In certain embodiments, for instance, a carbon layer (e.g., graphite) may be positioned between the solid electrolyte and the silver layer that can help further limit contact of the silver layer with the solid electrolyte.

In addition, a layer may be employed in certain embodiments that overlies the dielectric and includes an organometallic compound. The organometallic compound may have the following general formula:

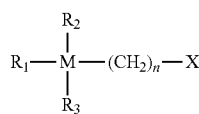

wherein,

M is an organometallic atom, such as silicon, titanium, and so forth;

$R_1$, $R_2$, and $R_3$ are independently an alkyl (e.g., methyl, ethyl, propyl, etc.) or a hydroxyalkyl (e.g., hydroxymethyl, hydroxyethyl, hydroxypropyl, etc.), wherein at least one of $R_1$, $R_2$, and $R_3$ is a hydroxyalkyl;

n is an integer from 0 to 8, in some embodiments from 1 to 6, and in some embodiments, from 2 to 4 (e.g., 3); and X is an organic or inorganic functional group, such as glycidyl, glycidyloxy, mercapto, amino, vinyl, etc.

In certain embodiments, $R_1$, $R_2$, and $R_3$ may a hydroxyalkyl (e.g., $OCH_3$). In other embodiments, however, $R_1$ may be an alkyl (e.g., $CH_3$) and $R_2$ and $R_3$ may a hydroxyalkyl (e.g., $OCH_3$).

Further, in certain embodiments, M may be silicon so that the organometallic compound is an organosilane compound, such as an alkoxysilane. Suitable alkoxysilanes may include, for instance, 3-aminopropyltrimethoxysilane, 3-aminopropyltriethoxysilane, 3-aminopropylmethyldimethoxysilane, 3-aminopropylmethyldiethoxysilane, 3-(2-aminoethyl)aminopropyltrimethoxysilane, 3-mercaptopropyltrimethoxysilane, 3-mercaptopropyltriethoxysilane, 3-mercaptopropylmethyldimethoxysilane, 3-mercaptopropylmethyldiethoxysilane, glycidoxymethyltrimethoxysilane, glycidoxymethyltriethoxysilane, glycidoxymethyl-tripropoxysilane, glycidoxymethyltributoxysilane, β-glycidoxyethyltrimethoxysilane, β-glycidoxyethyltriethoxysilane, β-glycidoxyethyltripropoxysilane, β-glycidoxyethyltributoxysilane, β-glycidoxyethyltrimethoxysilane, α-glycidoxyethyltriethoxysilane, α-glycidoxyethyltripropoxysilane, α-glycidoxyethyltributoxysilane, γ-glycidoxypropyltrimethoxysilane, γ-glycidoxypropyltriethoxysilane, γ-glycidoxypropyl-tripropoxysilane, γ-glycidoxypropyltributoxysilane, β-glycidoxypropyltrimethoxysilane, β-glycidoxypropyl-triethoxysilane, β-glycidoxypropyl-tripropoxysilane, α-glycidoxypropyltributoxysilane, α-glycidoxypropyltrimethoxysilane, α-glycidoxypropyltriethoxysilane, α-glycidoxypropyl-tripropoxysilane, α-glycidoxypropyltributoxysilane, γ-glycidoxybutyltrimethoxysilane, δ-glycidoxybutyltriethoxysilane, δ-glycidoxybutyltripropoxysilane, δ-glycidoxybutyl-tributoxysilane, δ-glycidoxybutyltrimethoxysilane, γ-glycidoxybutyltriethoxysilane, γ-glycidoxybutyl-tripropoxysilane, γ-propoxybutyltributoxysilane, δ-glycidoxybutyltrimethoxysilane, δ-glycidoxybutyltriethoxysilane, δ-glycidoxybutyltripropoxysilane, α-glycidoxybutyltrimethoxysilane, α-glycidoxybutyltriethoxysilane, α-glycidoxybutyltripropoxysilane, α-glycidoxybutyltributoxysilane, (3,4-epoxycyclohexyl)-methyltrimethoxysilane, (3,4-epoxycyclohexyl)methyltriethoxysilane, (3,4-epoxycyclohexyl)methyltripropoxysilane, (3,4-epoxycyclohexyl)-methyltributoxysilane, (3,4-epoxycyclohexyl)ethyltrimethoxysilane, (3,4-epoxycyclohexyl)ethyltriethoxysilane, (3,4-epoxycyclohexyl)ethyltripropoxysilane, (3,4-epoxycyclohexyl)ethyltributoxysilane, (3,4-epoxycyclohexyl)propyltrimethoxysilane, (3,4-epoxycyclohexyl)propyltriethoxysilane, (3,4-epoxycyclohexyl)propyltripropoxysilane, (3,4-epoxycyclohexyl)propyltributoxysilane, (3,4-epoxycyclohexyl)butyltrimethoxysilane, (3,4-epoxycyclohexy)butyltriethoxysilane, (3,4-epoxycyclohexyl)butyltripropoxysilane, (3,4-epoxycyclohexyl)butyltributoxysilane, and so forth.

The particular manner in which the layer is applied to the capacitor body may vary as desired. In one particular embodiment, the compound is dissolved in an organic solvent and applied to the part as a solution, such as by screen-printing, dipping, electrophoretic coating, spraying, etc. The organic solvent may vary, but is typically an alcohol, such as methanol, ethanol, etc. Organometallic compounds may constitute from about 0.1 wt. % to about 10 wt. %, in some embodiments from about 0.2 wt. % to about 8 wt. %, and in some embodiments, from about 0.5 wt. % to about 5 wt. % of the solution. Solvents may likewise constitute from about 90 wt. % to about 99.9 wt. %, in some embodiments from about 92 wt. % to about 99.8 wt. %, and in some embodiments, from about 95 wt. % to about 99.5 wt. % of the solution. Once applied, the part may then be dried to remove the solvent therefrom and form a layer containing the organometallic compound.

III. Terminations

Once the desired layers are formed, the capacitor assembly may be provided with terminations. For example, the capacitor assembly may contain an anode termination to which an anode lead of the capacitor element is electrically connected and a cathode termination to which the cathode of the capacitor element is electrically connected. Any conductive material may be employed to form the terminations, such as a conductive metal (e.g., copper, nickel, silver, nickel, zinc, tin, palladium, lead, copper, aluminum, molybdenum, titanium, iron, zirconium, magnesium, and alloys thereof). Particularly suitable conductive metals include, for instance, copper, copper alloys (e.g., copper-zirconium, copper-magnesium, copper-zinc, or copper-iron), nickel, and nickel alloys (e.g., nickel-iron). The thickness of the terminations is generally selected to minimize the thickness of the capacitor. For instance, the thickness of the terminations may range from about 0.05 to about 1 millimeter, in some embodiments from about 0.05 to about 0.5 millimeters, and from about 0.07 to about 0.2 millimeters. One exemplary conductive material is a copper-iron alloy metal plate available from Wieland (Germany). If desired, the surface of the terminations may be electroplated with nickel, silver, gold, tin, etc. as is known in the art to ensure that the final part is mountable to the circuit board. In one particular embodiment, both surfaces of the terminations are plated with nickel and silver flashes, respectively, while the mounting surface is also plated with a tin solder layer.

The terminations may be connected to the capacitor element using any technique known in the art. In one embodiment, for example, a lead frame may be provided that defines the cathode termination and anode termination. To attach the capacitor element to the lead frame, a conductive adhesive may initially be applied to a surface of the cathode termination. The conductive adhesive may include, for instance, conductive metal particles contained with a resin composition. The metal particles may be silver, copper, gold, platinum, nickel, zinc, bismuth, etc. The resin composition may include a thermoset resin (e.g., epoxy resin), curing agent (e.g., acid anhydride), and coupling agent (e.g., silane coupling agents). Suitable conductive adhesives may be described in U.S. Patent Application Publication No. 2006/0038304 to Osako, et al. Any of a variety of techniques may be used to apply the conductive adhesive to the cathode termination. Printing techniques, for instance, may be employed due to their practical and cost-saving benefits. The anode lead may also be electrically connected to the anode termination using any technique known in the art, such as mechanical welding, laser welding, conductive adhesives, etc. Upon electrically connecting the anode lead to the anode termination, the conductive adhesive may then be cured to ensure that the electrolytic capacitor is adequately adhered to the cathode termination.

Referring to FIG. 1, for example, a capacitor assembly 30 is shown as including an anode termination 62 and a cathode termination 72 in electrical connection with a capacitor element 33. Although it may be in electrical contact with any of the surfaces of the capacitor element 33, the cathode termination 72 in the illustrated embodiment is in electrical contact with the lower surface 39 via a conductive adhesive. More specifically, the cathode termination 72 contains a first component 73 that is in electrical contact and generally parallel with the lower surface 39 of the capacitor element 33. The cathode termination 72 may also contain a second component 74 that is substantially perpendicular to the first component 73 and in electrical contract with a rear surface 38 of the capacitor element 33. The anode termination 62 likewise contains a first component 63 positioned substantially perpendicular to a second component 64. The first component 63 is in electrical contact and generally parallel with the lower surface 39 of the capacitor element 33. The second component 64 contains a region 51 that carries an anode lead 16. Although not depicted in FIG. 1, the region 51 may possess a "U-shape" to further enhance surface contact and mechanical stability of the lead 16.

The terminations may be connected to the capacitor element using any technique known in the art. In one embodiment, for example, a lead frame may be provided that defines the cathode termination 72 and anode termination 62. To attach the capacitor element 33 to the lead frame, the conductive adhesive may initially be applied to a surface of the cathode termination 72. The conductive adhesive may include, for instance, conductive metal particles contained with a resin composition. The metal particles may be silver, copper, gold, platinum, nickel, zinc, bismuth, etc. The resin composition may include a thermoset resin (e.g., epoxy resin), curing agent (e.g., acid anhydride), and coupling agent (e.g., silane coupling agents). Suitable conductive adhesives may be described in U.S. Patent Publication No. 2006/0038304 to Osako, et al. Any of a variety of techniques may be used to apply the conductive adhesive to the cathode termination 72. Printing techniques, for instance, may be employed due to their practical and cost-saving benefits.

A variety of methods may generally be employed to attach the terminations. In one embodiment, for example, the second component 64 of the anode termination 62 is initially bent upward to the position shown in FIG. 1. Thereafter, the capacitor element 33 is positioned on the cathode termination 72 so that its lower surface 39 contacts the adhesive and the anode lead 16 is received by the region 51. If desired, an insulating material (not shown), such as a plastic pad or tape, may be positioned between the lower surface 39 of the capacitor element 33 and the first component 63 of the anode termination 62 to electrically isolate the anode and cathode terminations.

The anode lead 16 is then electrically connected to the region 51 using any technique known in the art, such as mechanical welding, laser welding, conductive adhesives, etc. For example, the anode lead 16 may be welded to the anode termination 62 using a laser. Lasers generally contain resonators that include a laser medium capable of releasing photons by stimulated emission and an energy source that excites the elements of the laser medium. One type of suitable laser is one in which the laser medium consist of an aluminum and yttrium garnet (YAG), doped with neodymium (Nd). The excited particles are neodymium ions $Nd^{3+}$. The energy source may provide continuous energy to the laser medium to emit a continuous laser beam or energy discharges to emit a pulsed laser beam. Upon electrically connecting the anode lead 16 to the anode termination 62, the conductive adhesive may then be cured. For example, a heat press may be used to apply heat and pressure to ensure that the electrolytic capacitor element 33 is adequately adhered to the cathode termination 72 by the adhesive.

IV. Casing Material

The capacitor element may be encapsulated with a casing material so that at least a portion of the anode and cathode terminations are exposed for mounting onto a circuit board. As shown in FIG. 1, for instance, the capacitor element 33 may be encapsulated within a casing material 28 so that a portion of the anode termination 62 and a portion of the cathode termination 72 are exposed.

The casing material may contain an epoxy composition that comprises one or more inorganic oxide fillers and a resinous material that includes one more epoxy resins that are crosslinked with a co-reactant (hardener). To help improve the overall moisture resistance of the casing material, the content of the inorganic oxide fillers is maintained at a high level, such as about 75 wt. % or more, in some embodiments about 76 wt. % or more, and in some embodiments, from about 77 wt. % to about 90 wt. % of the composition. The nature of the inorganic oxide fillers may vary, such as silica, alumina, zirconia, magnesium oxides, iron oxides (e.g., iron hydroxide oxide yellow), titanium oxides (e.g., titanium dioxide), zinc oxides (e.g., boron zinc hydroxide oxide), copper oxides, zeolites, silicates, clays (e.g., smectite clay), etc., as well as composites (e.g., alumina-coated silica particles) and mixtures thereof. Regardless of the particular fillers employed, however, a substantial portion, if not all, of the inorganic oxide fillers is typically in the form of vitreous silica, which is believed to further improve the moisture resistance of the casing material due to its high purity and relatively simple chemical form. Vitreous silica may, for instance, constitute about 30 wt. % or more, in some embodiments from about 35 wt. % to about 90 wt. %, and in some embodiments, from about 40 wt. % to about 80 wt. % of the total weight of fillers employed in the composition, as well as from about 20 wt. % to about 70 wt. %, in some embodiments from about 25 wt. % to about 65 wt. %, and in some embodiments, from about 30 wt. % to about 60 wt. % of the entire composition. Of course, other forms of silica may also be employed in combination with the vitreous silica, such as quartz, fumed silica, cristabolite, etc.

The resinous material typically constitutes from about 0.5 wt. % to about 25 wt. %, in some embodiments from about 1 wt. % to about 24 wt. %, and in some embodiments, from about 10 wt. % to about 23 wt. % of the composition. Generally speaking, any of a variety of different types of epoxy resins may be employed. Examples of suitable epoxy resins include, for instance, bisphenol A type epoxy resins, bisphenol F type epoxy resins, phenol novolac type epoxy resins, orthocresol novolac type epoxy resins, brominated epoxy resins and biphenyl type epoxy resins, cyclic aliphatic epoxy resins, glycidyl ester type epoxy resins, glycidylamine type epoxy resins, cresol novolac type epoxy resins, naphthalene type epoxy resins, phenol aralkyl type epoxy resins, cyclopentadiene type epoxy resins, heterocyclic epoxy resins, etc. To help provide the desired degree of moisture resistance, however, it is particularly desirable to employ epoxy phenol novolac ("EPN") resins, which are glycidyl ethers of phenolic novolac resins. These resins can be prepared, for example, by reaction of phenols with an excess of formaldehyde in the presence of an acidic catalyst to produce the phenolic novolac resin. Novolac epoxy resins are then prepared by reacting the phenolic novolac resin with epichlorihydrin in the presence of sodium hydroxide. Specific examples of the novolac-type epoxy resins include a phenol-novolac epoxy resin, cresol-novolac epoxy resin, naphthol-novolac epoxy resin, naphthol-phenol co-condensation novolac epoxy resin, naphthol-cresol co-condensation novolac epoxy resin, brominated phenol-novolac epoxy resin, etc. Regardless of the type of resin selected, the resulting phenolic novolac epoxy resins typically have more than two oxirane groups and can be used to produce cured coating compositions with a high crosslinking density, which can be particularly suitable for enhancing moisture resistance. One such phenolic novolac epoxy resin is poly [(phenyl glycidyl ether)-co-formaldehyde]. Other suitable resins are commercially available under the trade designation ARALDITE (e.g., GY289, EPN 1183, EP 1179, EPN 1139, and EPN 1138) from Huntsman.

The epoxy resin may be crosslinked with a co-reactant (hardener) to further improve the mechanical properties of the composition and also enhance its overall moisture resistance as noted above. Examples of such co-reactants may include, for instance, polyamides, amidoamines (e.g., aromatic amidoamines such as aminobenzamides, aminobenzanilides, and aminobenzenesulfonamides), aromatic diamines (e.g., diaminodiphenylmethane, diaminodiphenylsulfone, etc.), aminobenzoates (e.g., trimethylene glycol di-p-aminobenzoate and neopentyl glycol di-p-amino-benzoate), aliphatic amines (e.g., triethylenetetramine, isophoronediamine), cycloaliphatic amines (e.g., isophorone diamine), imidazole derivatives, guanidines (e.g., tetramethylguanidine), carboxylic acid anhydrides (e.g., methylhexahydrophthalic anhydride), carboxylic acid hydrazides (e.g., adipic acid hydrazide), phenolic-novolac resins (e.g., phenol novolac, cresol novolac, etc.), carboxylic acid amides, etc., as well as combinations thereof. Phenolic-novolac resins may be particularly suitable for use.

Apart from the components noted above, it should be understood that still other additives may also be employed in the epoxy composition used to form the casing, such as photoinitiators, viscosity modifiers, suspension aiding agents, pigments, stress reducing agents, coupling agents (e.g., silane coupling agents), stabilizers, etc. When employed, such additives typically constitute from about 0.1 to about 20 wt. % of the total composition.

The particular manner in which the casing material is applied to the capacitor body may vary as desired. In one particular embodiment, the capacitor element is placed in a mold and the casing material is applied to the capacitor element so that it occupies the spaces defined by the mold and leaves exposed at least a portion of the anode and cathode terminations. The casing material may be initially provided in the form of a single or multiple compositions. For instance, a first composition may contain the epoxy resin and the second composition may contain the co-reactant. Regardless, once it is applied, the casing material may be heated or allowed to stand at ambient temperatures so that the epoxy resin is allowed to crosslink with the co-reactant, which thereby causes the epoxy composition to cure and harden into the desired shape of the case. For instance, the composition may be heated to a temperature of from about 15° C. to about 150° C., in some embodiments from about 20° C. to about 120° C., and in some embodiments, from about 25° C. to about 100° C.

Although by no means required, a moisture barrier layer may also be employed that coats all or a portion of the casing material. The moisture barrier layer is generally formed from a hydrophobic elastomer, such as silicones, fluoropolymers, etc. Silicone elastomers are particularly suitable for use in the moisture barrier layer of the present invention. Such elastomers are typically derived from polyorganosiloxanes, such as those having the following general formula:

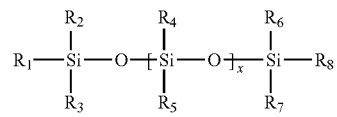

wherein, x is an integer greater than 1; and $R_1$, $R_2$, $R_3$, $R_4$, $R_5$, $R_6$, $R_7$, and $R_5$ are independently monovalent groups typically containing from 1 to about 20 carbon atoms, such as alkyl groups (e.g., methyl, ethyl, propyl, pentyl, octyl, undecyl, octadecyl, etc.); alkoxy groups (e.g., methoxy, ethoxy, propoxy, etc.); carboxyalkyl groups (e.g., acetyl); cycloalkyl groups (e.g., cyclohexyl); alkenyl groups (e.g., vinyl, allyl, butenyl, hexenyl, etc.); aryl groups (e.g., phenyl, tolyl, xylyl, benzyl, 2-phenylethyl, etc.); and halogenated hydrocarbon groups (e.g., 3,3,3-trifluoropropyl, 3-chloropropyl, dichlorophenyl, etc.). Examples of such polyorganosiloxanes may include, for instance, polydimethylsiloxane ("PDMS"), polymethylhydrogensiloxane, dimethyidiphenylpolysiloxane, dimethyl/ methylphenylpolysiloxane, polymethylphenylsiloxane, methylphenyl/dimethylsiloxane, vinyldimethyl terminated polydimethylsiloxane, vinylmethyl/dimethylpolysiloxane, vinyldimethyl terminated vinylmethyl/dimethylpolysiloxane, divinylmethyl terminated polydimethylsiloxane, vinylphenylmethyl terminated polydimethylsiloxane, dimethylhydro terminated polydimethylsiloxane, methylhydro/dimethylpolysiloxane, methylhydro terminated methyloctylpolysiloxane, methylhydro/phenylmethyl polysiloxane, fluoro-modified polysiloxane, etc. To form an elastomer, the polyorganosiloxane may be crosslinked using any of a variety of known techniques, such as by catalyst curing (e.g., platinum catalysts), room temperature vulcanization, moisture curing, etc. Crosslinking agents may be employed, such as alkoxy silanes having the formula Si—OR, wherein R is H, alkyl (e.g., methyl), alkenyl, carboxyalkyl (e.g., acetyl), and so forth.

In addition to being hydrophobic, it is generally desired that the material used to form the moisture barrier layer has a relatively low modulus and a certain degree of flexibility, which can help absorb some of the thermal stresses caused by expansion of the casing and also allow it to be subjected to compressive forces. The flexibility of the material may be characterized by a corresponding low modulus of elasticity ("Young's modulus"), such as about 5,000 kilopascals ("kPa") or less, in some embodiments from about 1 to about 2,000 kPa, and in some embodiments, from about 2 to about 500 kPa, measured at a temperature of about 25° C. The material also typically possesses a certain degree of strength that allows it to retain its shape even when subjected to compressive forces. For example, the material may possess a tensile strength of from about 1 to about 5,000 kPa, in some embodiments from about 10 to about 2,000 kPa, and in some embodiments, from about 50 to about 1,000 kPa, measured at a temperature of about 25° C. With the conditions noted above, the hydrophobic elastomer can even further enhance the ability of the capacitor to function under extreme conditions.

To help achieve the desired flexibility and strength properties, a non-conductive filler may be employed in the moisture barrier layer. When employed, such additives typically constitute from about 0.5 wt. % to about 30 wt. %, in some embodiments from about 1 wt. % to about 25 wt. %, and in some embodiments, from about 2 wt. % to about 20 wt. % of the moisture barrier layer. The silicone elastomer may constitute from about 70 wt. % to about 99.5 wt. %, in some embodiments from about 75 wt. % to about 99 wt. %, and in some embodiments, from about 80 wt. % to about 98 wt. % of the moisture barrier layer. One particular example of such a filler includes, for instance, silica. While most forms of silica contain a relatively hydrophilic surface due to the presence of silanol groups (Si—OH), the silica may optionally be surface treated so that its surface contains $(CH_3)_n$—Si— groups, wherein n is an integer of 1 to 3, which further enhances the hydrophobicity of the moisture barrier layer. The surface treatment agent may, for example, be an organosilicon compound monomer having a hydrolyzable group or a partial hydrolyzate thereof. Examples of such compounds may include organosilazanes, silane coupling agents such as described above, etc.

Due to this construction, the resulting capacitor assembly can exhibit a variety of beneficial properties. For example, the dissipation factor of the capacitor assembly may be maintained at relatively low levels. The dissipation factor generally refers to losses that occur in the capacitor and is usually expressed as a percentage of the ideal capacitor performance. For example, the dissipation factor of the capacitor may be from about 1% to about 25%, in some embodiments from about 3% to about 10%, and in some embodiments, from about 5% to about 15%, as determined at a frequency of 120 Hz. The capacitor assembly may also be able to be employed in high voltage applications, such as at rated voltages of about 35 volts or more, in some embodiments about 50 volts or more, and in some embodiments, from about 60 volts to about 200 volts. The capacitor assembly may, for example, exhibit a relatively high "breakdown voltage" (voltage at which the capacitor fails), such as about 2 volts or more, in some embodiments about 5 volts or more, in some embodiments about 10 volts or more, and in some embodiments, from about 10 to about 100 volts. Likewise, the capacitor assembly may also be able to withstand relatively high surge currents, which is also common in high voltage applications. The peak surge current may be, for example, about 100 Amps or more, in some embodiments about 200 Amps or more, and in some embodiments, and in some embodiments, from about 300 Amps to about 800 Amps.

The present invention may be better understood by reference to the following examples.

Test Procedures

Capacitance

The capacitance may be measured using a Keithley 3330 Precision LCZ meter with Kelvin Leads with 2.2 volt DC bias and a 0.5 volt peak to peak sinusoidal signal. The operating frequency may be 120 Hz.

Example 1

Various stages of capacitor formation were evaluated using the present technique. Tantalum powder was used to form anode samples. Each anode sample was embedded with a tantalum wire, pressed, and sintered. The resulting pellets were anodized in a liquid electrolyte to form a dielectric layer. A conductive polymer coating was then formed by in situ PEDT polymerization. Where applicable, the parts were then dipped into a graphite dispersion and dried. Where applicable, the parts were dipped into a silver dispersion and dried.

Figure 4A:
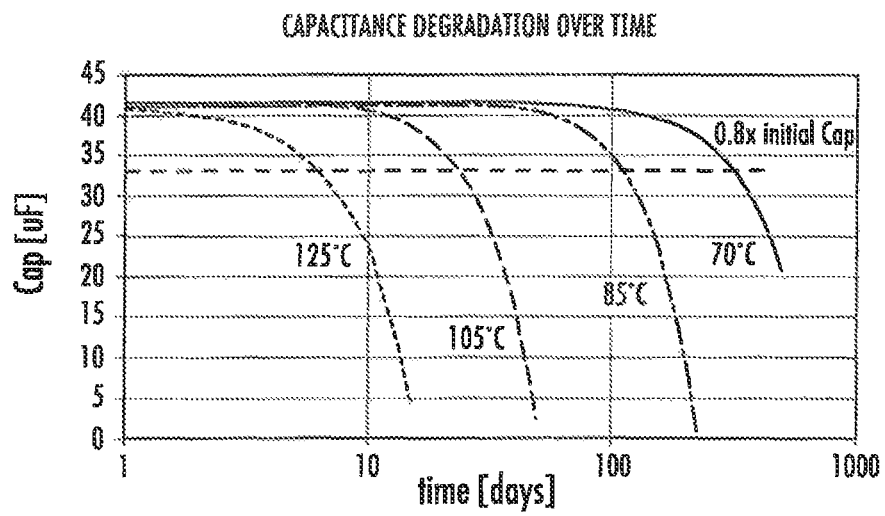
FIGS. 4a and 4b illustrate the application of one embodiment of a lifetime determining technique in accordance with the present invention.

The capacitance was measured after several times of storage at 125° C., 105° C., 85° C., and 70° C. This storage and measurement was performed for various stages of the capacitor where the "stage" refers to the most external component of the capacitor tested (e.g., "Internals" refers to a capacitor element comprising an internal polymer electrolyte and no external polymer layer or graphite or silver). Results measured for capacitors in stage "Internals" are illustrated in FIG. 4a.

Figure 4B:
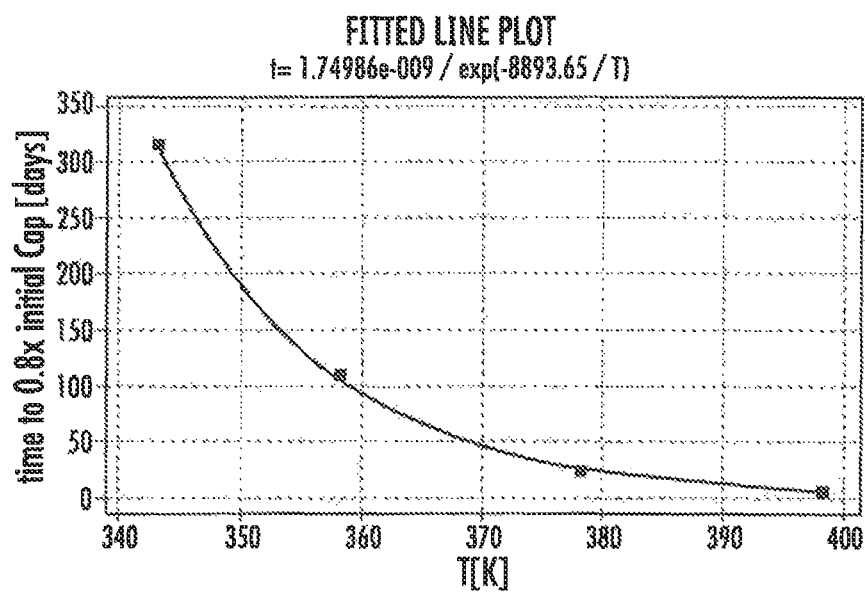

The time to decrease capacitance to 0.8× the initial capacitance at various thermodynamic temperatures is illustrated in FIG. 4b.

The time to capacitance degradation of 0.8× the initial capacitance was expressed by using of technique 1 and parameters estimated by using of nonlinear regression provided by Minitab software package (Minitab® version 16.2.4).

$$\text{time} = 1.74986e\text{-}009/\exp(-8893.65/T) \tag{10}$$

Activation energy can then be calculated as 0.766 eV using technique (10) and value of Boltzmann constant. Time to degradation of capacitance to 0.8× the initial capacitance at other temperatures can be calculated using technique (10).

For example, at 60° C., the calculated time is 687 days; at 25° C., the calculated time is 15768 days, and at 175° C., the calculated time is 0.7 days.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A capacitor lifetime determining system comprising:
   a capacitor element, wherein the capacitor element comprises a sintered porous anode body, a dielectric that overlies the anode body, and a solid electrolyte that overlies the dielectric;
   a capacitance measuring device, the measuring device configured to measure the capacitance of the capacitor element;
   a control device, the control device configured to apply thermodynamic temperatures to the system; and
   a computing device, wherein the computing device is configured to determine constants A/x and −E/k associated with data obtained at the applied thermodynamic temperatures based on technique (1):

$$\frac{A}{x} t e^{[\frac{-E}{k}]\frac{1}{T}} = 1 \quad (1)$$

wherein x is an amount of oxidized solid electrolyte, t is a time in which the capacitance of the capacitor element is decreased by a specified level, T is a thermodynamic temperature, A is a frequency factor, k is Boltzmann constant, e is Euler constant, and E is an activation energy of the reaction;
   wherein the computing device is configured to determine a time to degradation to the specified level at a proposed thermodynamic temperature using the activation energy and frequency factor associated with the applied thermodynamic temperatures based on technique (1); and
   wherein the solid electrolyte comprises a conductive polymer.

2. The capacitor lifetime determining circuit of claim 1, wherein the capacitor element is exposed to an oxygen-containing environment.

3. The capacitor lifetime determining circuit of claim 1, wherein the conductive polymer comprises poly(3,4-ethylenedioxythiophene).

4. The capacitor lifetime determining circuit of claim 1, wherein the sintered anode body comprises tantalum.

5. The capacitor lifetime determining circuit of claim 1, wherein the capacitor element comprises a graphite layer disposed along the solid electrolyte.

6. The capacitor lifetime determining circuit of claim 5, wherein the capacitor element comprises a silver layer disposed along the graphite layer.

7. The capacitor lifetime determining circuit of claim 1, wherein the applied thermodynamic temperatures range from 70° C. to 175° C.

8. The capacitor lifetime determining circuit of claim 1, wherein the proposed thermodynamic temperature ranges from 20° C. to 175° C.

9. A method of determining the lifetime of a capacitor comprising:
   controlling a first temperature to which a first capacitor element is exposed,
   measuring a capacitance of the first capacitor element after exposure to the first temperature,
   determining a time in which the capacitance of the first capacitor element during exposure to the first temperature is decreased by a specified level,
   controlling a second temperature to which a second capacitor element is exposed,
   measuring a capacitance of the second capacitor element after exposure to the second temperature,
   determining a time in which the capacitance of the second capacitor element during exposure to the second temperature is decreased by the specified level,
   applying technique (1) to determine constants A/x and −E/k associated with the first and second temperatures:

$$\frac{A}{x} t e^{[\frac{-E}{k}]\frac{1}{T}} = 1, \quad (1)$$

wherein x is an amount of oxidized solid electrolyte, t is time, T is thermodynamic temperature, A is a frequency factor, k is Boltzmann constant, e is Euler constant, and E is activation energy of the reaction and applying the constants A/x and −E/k associated with the first and second temperatures to technique (1); and
   determining a time to degradation at a third temperature, wherein the first and second capacitor elements comprise a sintered anode body, a dielectric formed along the sintered anode body, and a solid electrolyte formed along the dielectric; and wherein the solid electrolyte comprises a conductive polymer.

10. The method of claim 9, further comprising controlling a plurality of temperatures to which a plurality of capacitor elements are exposed, measuring the capacitance of each of the plurality of capacitor elements after temperature exposure, and determining the time for degradation of the capacitance of each of the plurality of capacitor elements to the specified level.

11. The method of claim 9, further comprising plotting the time for degradation of the capacitance of the first and second capacitor elements at the first and second temperatures.

12. The method of claim 9, wherein each of the first and second capacitor elements comprise a graphite layer disposed along the solid electrolyte.

13. The method of claim 12, wherein each of the first and second capacitor elements comprise a silver layer disposed along the graphite layer.

14. The method of claim 10, wherein each of the capacitor elements of the plurality of capacitor elements comprises one or more of an external layer comprising a conductive polymer, a graphite layer, and a silver layer.

15. The method of claim 9, wherein the first and second temperatures range from 70° C. to 175° C.

16. The method of claim 9, wherein the third temperature ranges from 20° C. to 175° C.

17. The method of claim 9, further comprising contacting the first and second capacitor elements with an atmosphere having a relative humidity of 10% or more.

18. The method of claim 9, wherein the conductive polymer comprises poly(3,4-ethylenedioxythiophene).

19. The method of claim 9, wherein the sintered anode body comprises tantalum.

20. The method of claim 9, further comprising exposing the first and second capacitor elements to an oxygen-containing environment.

* * * * *